(12) United States Patent
Gorokhovsky

(10) Patent No.: US 8,895,115 B2
(45) Date of Patent: Nov. 25, 2014

(54) METHOD FOR PRODUCING AN IONIZED VAPOR DEPOSITION COATING

(75) Inventor: Vladimir Gorokhovsky, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 948 days.

(21) Appl. No.: 12/942,786

(22) Filed: Nov. 9, 2010

(65) Prior Publication Data

US 2012/0114871 A1    May 10, 2012

(51) Int. Cl.
| | | |
|---|---|---|
| H05H 1/24 | (2006.01) | |
| C23C 14/35 | (2006.01) | |
| C23C 14/06 | (2006.01) | |
| C23C 14/16 | (2006.01) | |

(52) U.S. Cl.
CPC .......... *C23C 14/355* (2013.01); *C23C 14/0641* (2013.01); *C23C 14/165* (2013.01)
USPC ............ 427/569; 427/571; 427/576; 427/299

(58) Field of Classification Search
CPC .......... C23C 14/02; C23C 14/14; C23C 14/22
USPC .......................... 427/569, 576, 250, 571, 299
See application file for complete search history.

(56) References Cited

U.S. PATENT DOCUMENTS

| | | | | |
|---|---|---|---|---|
| 4,263,528 | A * | 4/1981 | Miram | 313/293 |
| 4,310,614 | A * | 1/1982 | Connell et al. | 430/270.12 |
| 4,982,696 | A * | 1/1991 | Kinoshita et al. | 118/723 VE |
| 5,133,849 | A | 7/1992 | Kinoshita et al. | |
| 5,277,938 | A * | 1/1994 | Wegmann et al. | 427/566 |
| 5,336,533 | A * | 8/1994 | Balmashnov et al. | 427/562 |
| 6,025,017 | A * | 2/2000 | Roth | 427/146 |
| 6,200,652 | B1 * | 3/2001 | Sun et al. | 427/573 |
| 6,521,104 | B1 | 2/2003 | Kidd et al. | |
| 6,645,354 | B1 | 11/2003 | Gorokhovsky | |
| 6,767,436 | B2 | 7/2004 | Wei | |
| 6,812,164 | B2 | 11/2004 | Yamaguchi et al. | |
| 6,905,582 | B2 | 6/2005 | Kidd et al. | |
| 2003/0161969 | A1 | 8/2003 | Hilliard | |
| 2003/0165617 | A1 * | 9/2003 | Kagadei et al. | 427/248.1 |
| 2004/0055870 | A1 | 3/2004 | Wei | |
| 2005/0029090 | A1 | 2/2005 | Yamaguchi et al. | |
| 2005/0227020 | A1 * | 10/2005 | Sharafutdinov et al. | 427/596 |
| 2007/0017804 | A1 | 1/2007 | Myrtveit et al. | |
| 2008/0309239 | A1 | 12/2008 | Kasai et al. | |
| 2009/0153010 | A1 * | 6/2009 | Perkins | 313/161 |
| 2009/0258164 | A1 | 10/2009 | Nakai et al. | |

OTHER PUBLICATIONS

Gorokhovsky, "Process in plasma arc installation for vacuum coating depositions Part 2. Plasma propogation," Surface and Coatings Technology, 61 (1993) 108-114.
Gorokhovsky, "Distributed Arc Sources," Vacuum Arc Science and Technology, Coating from the Vacuum Arc, Noyes Publications, 1995; pp. 423-444.
Musil, et al., "Magnetron Discharges for Thin Films Plasma Processing," Materials surface processing by directed energy techniques (2006); Chapter 3: pp. 67-110.
Wei et al., "Metal plasma immersion ion implantation and deposition (MPIII and D) using a metal plasma electron evaporation source (MPEES)," Surface & Coating Technology 200 (2005) 579-583.
Helmersson, et al. "Review Ionized physical vapor deposition (IPVD): A review of technology and applications," Thin Solid Films 513 (2006) 1-24.
Wilbur et al., "High-current-density metal-ion implantation," Rev. Sci. Instrum. 63 (4), Apr. 1992 pp. 2491-2493.
Wei, et al., "Deposition of thick nitrides and carbonitrides for sand erosion protection," vol. 201, Issue 7, Dec. 20, 2006, pp. 4453-4459; Proceedings of the 33rd International Conference on Metallurgical Coatings and Thin Films—ICMCTF 2006, The 33rd International Conference on Metallurgical Coatings and Thin Films.

* cited by examiner

*Primary Examiner* — Bret Chen
(74) *Attorney, Agent, or Firm* — Grossman, Tucker et al

(57) ABSTRACT

A method of depositing a coating by vapor deposition. The method including ionizing a process gas, generating a metal vapor and creating a metal flow having a metal atom flow density in the range of $1E14\ m^{-3}$ to $1E24\ m^{-3}$. The method also includes providing a thermionic emission from a thermionic ionizing grid including thermionic filaments, wherein said ionizing filament grid is at least partially located within said region having a metal atom flow density in the range of $1E14\ m^{-3}$ to $1E24\ m^{-3}$, and coating a substrate with the metal vapor.

8 Claims, 27 Drawing Sheets

METHOD FOR PRODUCING AN IONIZED VAPOR DEPOSITION COATING

FIELD OF THE INVENTION

The present disclosure relates to a method and apparatus for producing an ionized vapor deposition coating.

BACKGROUND

Vapor deposition may be generally understood as a mechanism of producing a film or coating and may include physical vapor deposition and chemical vapor deposition. In physical vapor deposition, a vaporized form of the coating material may condense on a substrate surface forming the coating. In chemical vapor deposition, one or more precursors may react and/or decompose on a substrate surface forming the coating. Conventional methods of vapor deposition, such as electron beam physical vapor deposition and magnetron sputtering may be used to produce metallic coatings. However, coatings produced in such a manner may exhibit relatively low density, poor adhesion, poor structure and/or poor morphology.

SUMMARY OF THE INVENTION

An aspect of the present disclosure relates to a vapor deposition coating system. The system may include a metal vapor source, a power supply coupled to the metal vapor source, and at least one thermionic ionizing grid including one or more thermionic filaments, wherein the ionizing grid is at least partially located within a region having a metal atom flow density in the range of $1E14\,m^{-3}$ to $1E24\,m^{-3}$ when the power supply coupled to the metal vapor source is energized. In addition, a heating power supply may be coupled to the thermionic ionizing grid, wherein the heating power supply is configured to heat the filaments to the thermionic emission temperature of the filaments. In some embodiments, the thermionic discharge may be energized between the thermionic ionizing grid connected to the negative pole of power supply as a cathode and the anode connected to the positive pole of the power supply.

Another aspect of the present disclosure relates to a method of depositing a coating by vapor deposition. The method may include ionizing a process gas, generating a metal vapor and creating a metal flow having a metal atom flow density in the range of $1E14\,m^{-3}$ to $1E24\,m^{-3}$. The method may also include providing a thermionic emission from a thermionic ionizing grid including thermionic filaments, wherein the ionizing filament grid is at least partially located within the region having a metal atom flow density in the range of $1E14\,m^{-3}$ to $1E24\,m^{-3}$ and coating a substrate with the metal vapor.

BRIEF DESCRIPTION OF THE DRAWINGS

The above-mentioned and other features of this disclosure, and the manner of attaining them, will become more apparent and better understood by reference to the following description of embodiments described herein taken in conjunction with the accompanying drawings, wherein.

DETAILED DESCRIPTION

Figure 1:
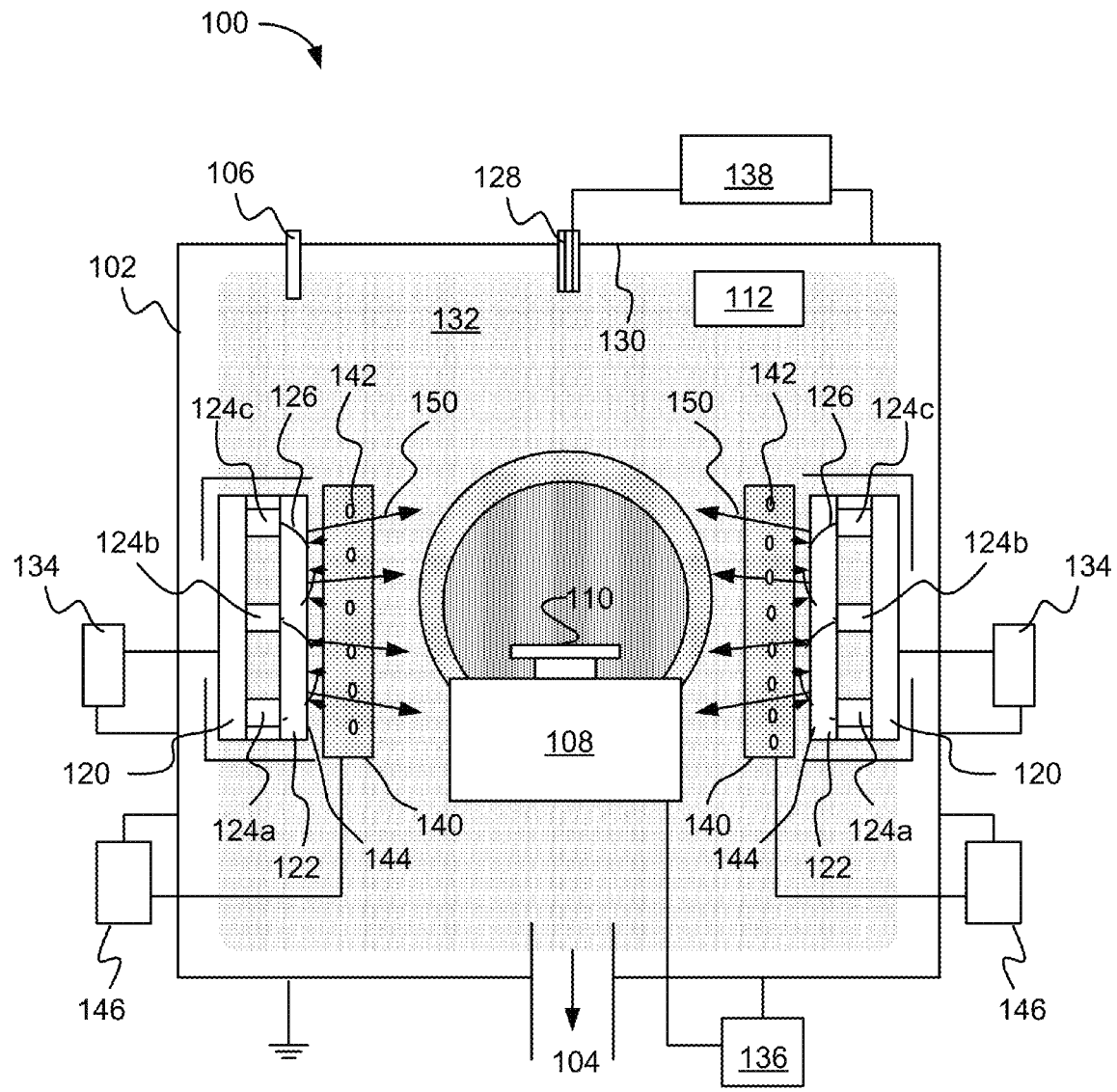
FIG. 1 illustrates a schematic diagram of an embodiment of a coating system contemplated herein including ionized filament grids in combination with magnetron sources.

It is to be understood that this disclosure is not limited in its application to the details of construction and the arrangement of components set forth in the following description or illustrated in the drawings. The embodiments herein are capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

The present disclosure relates to a method and apparatus for producing an ionized vapor deposition coating utilizing a thermionic ionizing cathode positioned in a region of relatively high metal flow density. The coating may be deposited via physical vapor deposition, such as through magnetron vapor deposition, cathodic arc deposition, ion-beam deposition, etc. In other embodiments chemical vapor deposition may be utilized or a hybrid processes including both physical vapor deposition and chemical vapor deposition may be utilized. The thermionic cathode may include a filament grid placed parallel to a magnetron target or a number of U-shaped filaments positioned around a magnetron target and extended across the magnetron discharge zone where the density of metal atoms may be higher.

An embodiment of a system for ionized magnetron sputtering of a metal vapor plasma source is illustrated in FIG. 1. The device 100 may include a vacuum chamber 102 with an outlet port 104, to which a vacuum pump may be operably coupled for evacuating air or gas out of the chamber 102 and an inlet 106 for providing one or more process gasses into the vacuum chamber 102. Process gasses may include reactive gasses such as precursor gasses or inert gasses such as argon, helium, nitrogen, etc. that may react with other gases or with the metal vapor provided by a metal vapor source.

A worktable 108 may be provided, upon which a substrate 110 may be positioned or secured. The worktable 108 may rotate around an axis A-A, as illustrated the axis may be relatively central to the worktable 108, however, the axis may be off-centered providing eccentric motion. The substrate 110 may include on or more surfaces upon which a coating may be deposited. A heater 112 may also be provided in the chamber 102, which may be used to pre-heat the substrate 110. In some embodiments, the heater 112 may be positioned at a location distant from the worktable 108, as illustrated. However, it may be appreciated that in other embodiments, the heater 112 may be integrated into the worktable 108. The heater 112 may heat the substrate 110 to temperatures of up to 1000° C., including all values and ranges from of 100° C. to 1000° C.

One or more metal vapor sources, such as magnetrons 120 may be provided in the chamber 102. The magnetrons may include a target 122 including the material to be deposited, such as a metal or a metal alloy. The metals or metal alloys may include, for example, titanium, chromium, iron, nickel, copper, silver, gold, silicon, aluminum, or other transition metals or metalloids, etc. The target 122 may be of any shape, such as circular, square, rectangular, etc.

One or more permanent magnets 124a, 124b, 124c, etc. (hereinafter referred to magnets 124) may be provided, aligned adjacent to one another with oppositely orientated poles. For example, magnets 124a and 124c may have the north pole adjacent to the target 122 and magnet 124b may have the south pole adjacent to the target, or vice versa. The magnets 124 may produce magnetic fields 126, which may be present along the length of the target 122. The magnets 124 may generally produce a magnetic field of 500 Gauss or more, including 1,000 Gauss or more. Ion current density generated by a magnetron 120 may be relatively uniform along the length of the target 122 and may be in the range of 0.1 mA/cm$^2$ to 500 mA/cm$^2$, including all values and ranges, such as 20 mA/cm$^2$.

Optionally, an additional plasma source may be provided. As illustrated in the embodiment of FIG. 1, the plasma source 128 may include a hollow cathode. Other examples, may include, for example a thermionic cathode utilizing one or more filaments made of tungsten, thoriated tungsten, tantalum or other materials with relatively high thermionic electron emission capabilities. The plasma source 128 may be located near the vacuum chamber wall 130, such as within 1 mm to 100 mm from the vacuum chamber wall 130. The plasma source 128 may provide a global plasma 132, which may spread through out the chamber 102. It may be appreciated that the plasma 132 may be formed from an inert gas supplied through the gas inlet port 106.

A number of power supplies may be provided to bias the magnetrons, work table, and the plasma source. For example, a magnetron power supply 134 may be coupled to each magnetron 120 within the system 100 to bias the magnetron 120 relative to either the substrate 110/worktable 108 or process chamber 102. The power supply may provide DC, DC pulse or RF bias to the magnetron 120 of −200 to −800V, 1 to 40 amperes, etc. (including all values and ranges therein) when active, or energizing the magnetron 120. A worktable power supply 136 coupled to the worktable 108. The power supply may provide DC, DC pulse or RF bias to the worktable 108 of −30 to −500V (including all values and ranges therein), 1 to 20 amperes, etc. (including all values and ranges therein), which may bias the worktable 108 relative to either the magnetron 120 or the process chamber 102 when active or energizing the worktable 108. A plasma source power supply 138 may be provided to bias the plasma source 128 relative to the magnetron. The plasma source power supply 138 may provide DC, DC pulse or RF bias to the plasma source 128 of −40 to −1000 V (including all values and ranges therein), 1 to 100 amperes, etc. (including all values and ranges therein), which may bias the plasma source 128 when active or energizing the plasma source.

Ionizing filaments, such as an ionizing filament grid 140 including a number of ionizing filaments 142 may also be provided between the magnetron target and the substrate 110. The ionizing filaments 142 may be thermionic. The filaments 142 may be positioned such that they are generally parallel to the target surface 144 and at least partially located within a region of relatively high metal flow density, which may be understood as a region having a substantially higher metal sputtering and/or gaseous particles density during magnetron sputtering when a bias is applied to the magnetron. The metal atom flow density may be in the range of $1E14$ m$^{-3}$ to $1E24$ m$^{-3}$, including all values and ranges therein. The metal atom flow density may be understood as the density of sputtered metal atoms flowing from or ejected from the target. If the atomic density near the ionizing filament grid is less than $1E14$ m$^{-3}$ the probability of ionization of atomic particles by electrons emitted by the grid may be too small. If the atomic density exceeds $1E24$ m$^{-3}$ the thermionic discharge may contract by forming cathodic arc spots with large energy densities exceeding $1E5$ J/cm$^2$ on filaments, which may destroy the filaments. The filaments may also be attached to one or more power supplies 146, such as a discharge power supply and or a heating power supply further discussed herein.

Figure 2:
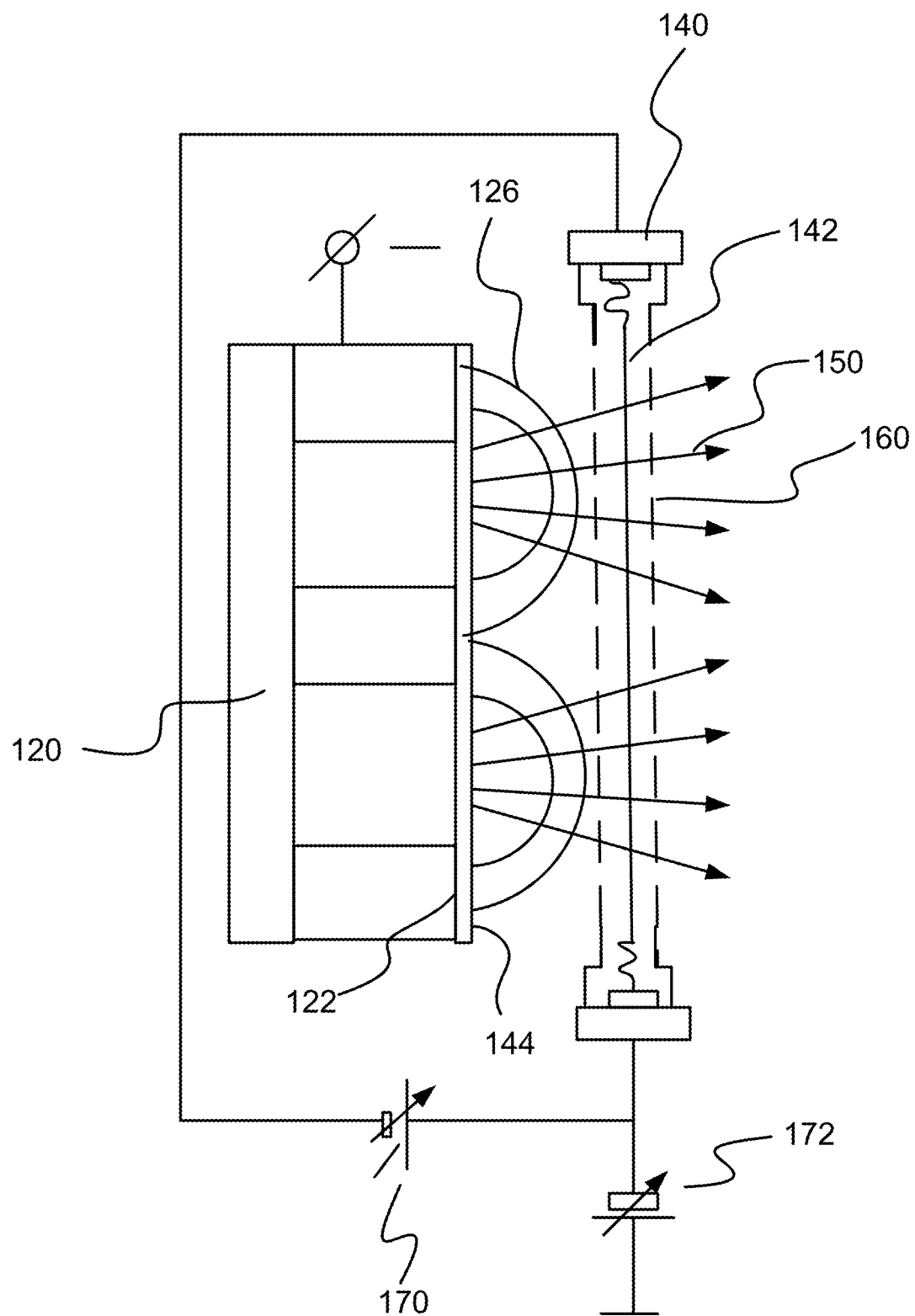
FIG. 2 illustrates a cross-sectional schematic diagram of an embodiment of an ionizing filament grid in combination with a magnetron source.

Embodiments of thermionic filament grids and the employment of such grids are illustrated in FIGS. 2 through 17. FIG. 2 illustrates a side view of an example of a grid 140 of thermionic filaments 142 positioned substantially parallel to the surface 144 of a target 122. The filament grid 140 may be at least partially or completely immersed in a relatively dense magnetron plasma discharge area 150. The relatively dense magnetron discharge area 150, which for example may have a metal vapor plasma density greater than or equal to $1E17$ m$^3$, may surround all or a portion of the filament grid 140. The relatively dense magnetron discharge area 150 may be in the range of 0.1 to 10 cm, including al values and ranges therein, from the target surface 144. Positioning the filaments closer than 0.1 cm from the target may result in a short circuit, which may destroy the filaments and damage the power supplies. Positioning the filaments at the distance from the magnetron target surface 144 exceeding 10 cm may, in some embodiments, reduce the effectiveness of ionizing the metal sputtering flow as the density of metal atoms in this region may be orders of magnitude smaller than near the magnetron target. Therefore, in some embodiments, the filament grid 140 may be positioned within 10 cm of the target surface 144, such as in the range of 0.1 cm to 10 cm of the target surface 144, including all values and ranges therein at 0.1 mm increments. Preferably, the filament grid may be within 1 cm to 4 cm of the target surface. The ends of the filaments 142 may be positioned or extend beyond the target surface 144.

Figure 3:
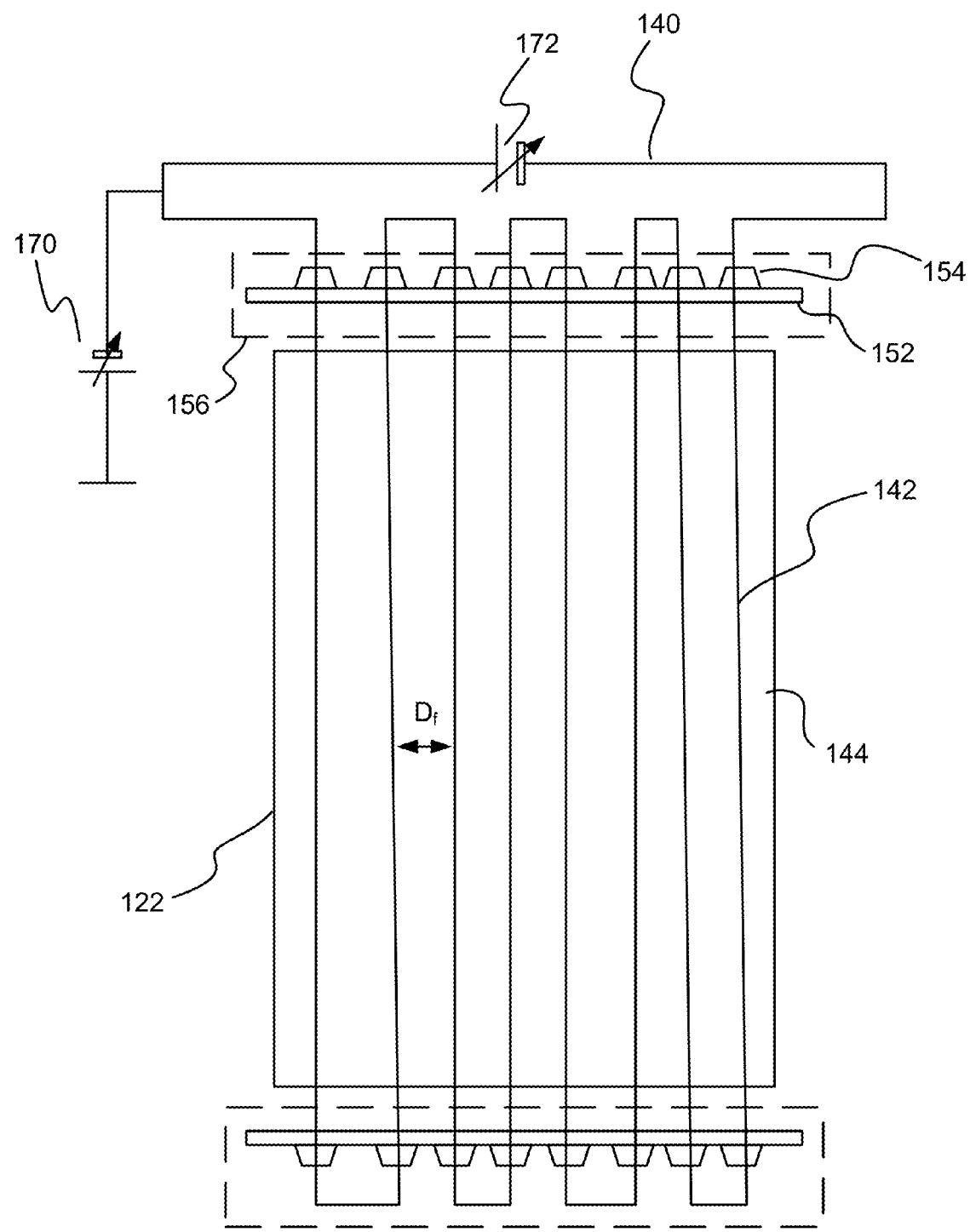
FIG. 3 illustrates a schematic diagram of a front or top view of an ionizing filament grid.
Figure 4:
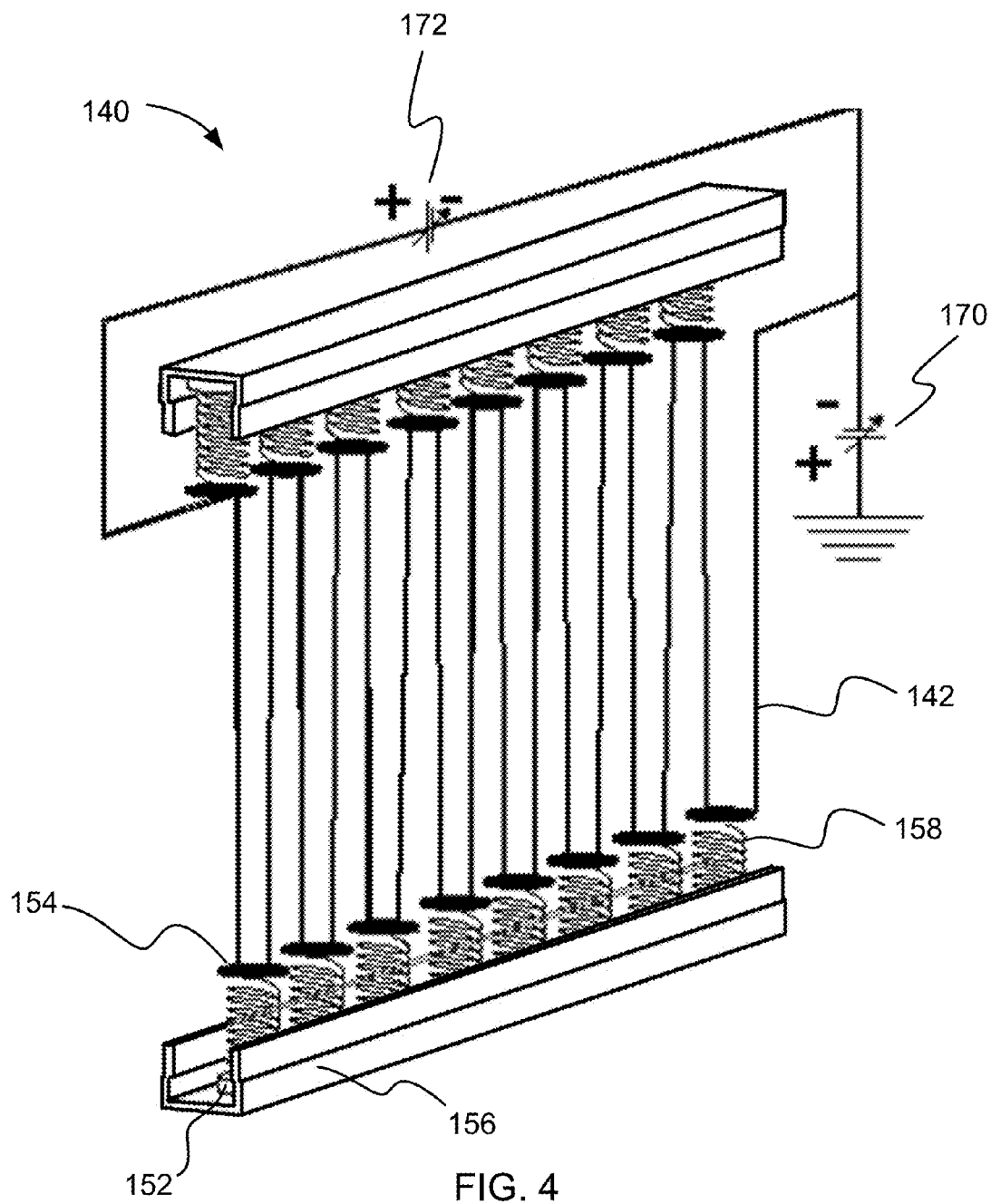
FIG. 4 illustrates a perspective view of a schematic diagram of an embodiment of an ionizing filament grid.

FIG. 3 illustrates a front view of an embodiment of a filament grid 140 and FIG. 4 illustrates a side view of the embodiment of FIG. 3. The filament grid 140 may include one or more holding bars 152 to which the filaments 142 may be attached or secured in place. Insulators 154 may be affixed between the filaments 142 and the holding bars 152 or the holding bar may be formed of an insulator, such as a ceramic insulator. In some embodiments, the insulators 154 and/or holding bars 152 may be protected from metallization by an isolative shield 156 which may form a part of the holding bar 152, affixed to the holding bar 152 or provided separately from the holding bar 152.

In addition, the filaments 142 may be held under tension to maintain the filament 142 geometry, such that the filaments 142 do not bend or sag due to thermionic or plasma heating. In some embodiments, the filaments 142 may be affixed to the holding bars 152 and/or insulators 154 via springs 158. The springs 158 may compensate for reductions in tension on the filaments 142 due to plasma heating. The filaments 142 may also be connected in series, such that the ends of the filaments 142 may be connected either directly or indirectly to each other.

The distance between individual filaments 142, "$D_f$", may be from 0.1 to 10 times the thickness of the plasma sheath 160 which forms around each individual filament biased (e.g., negatively biased) in relation to the surrounding plasma environment. In some embodiments "$D_f$" may be in the range of 0.1 mm to 30.0 mm, including all values and ranges therein, such as 1 mm to 15 mm, or 3 mm to 10 mm. The filaments 142 may be formed of tungsten, tantalum, thoriated tungsten wires, tungsten wires coated with oxides having low work function or similar refractory metals and may exhibit thermionic emission temperatures in the range of 1,200° C. to 3,000° C., including all values and ranges therein. In addition, the filaments may have a largest cross-sectional length or a diameter in the range of 10 μm to 2,000 μm, including all values and ranges therein, such as 40 μm to 1500 μm, or 40 μm to 300 μm.

Figure 5:
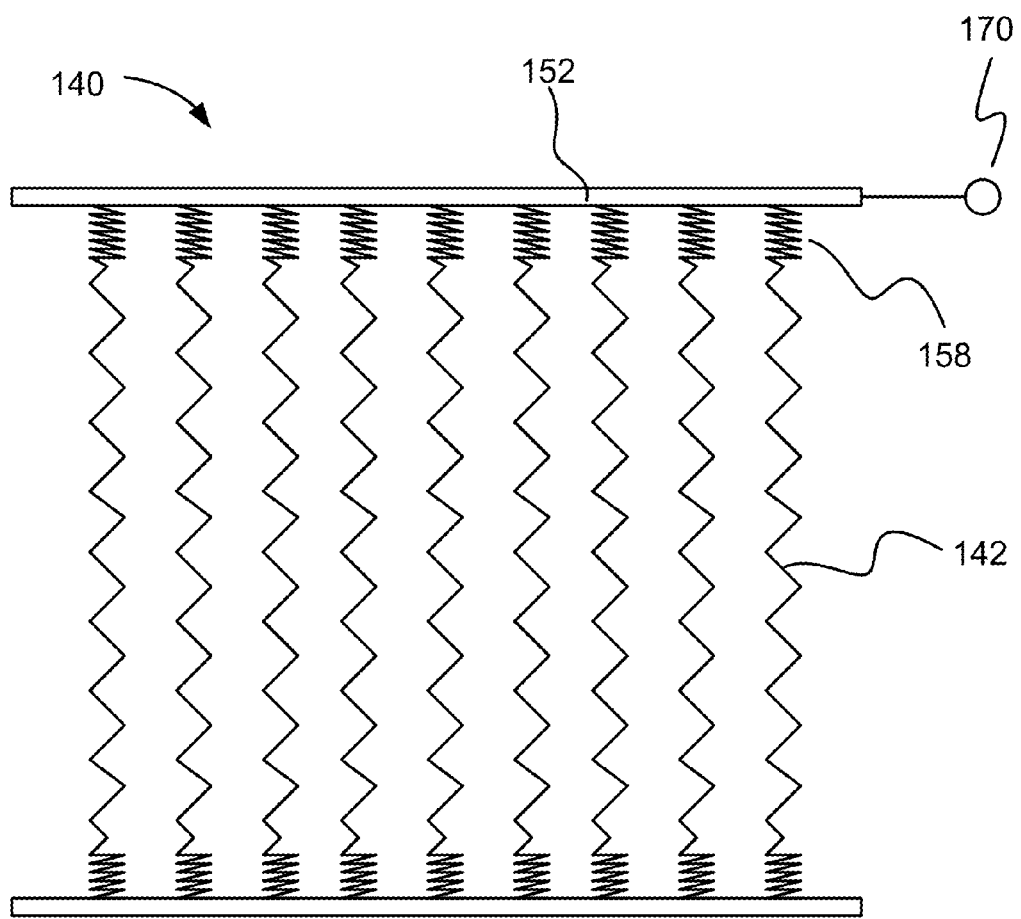
FIG. 5 illustrates a front view of a schematic diagram of an embodiment of an ionizing filament grid including zig zag filaments, which may be connected to a bias power supply.
Figure 6:
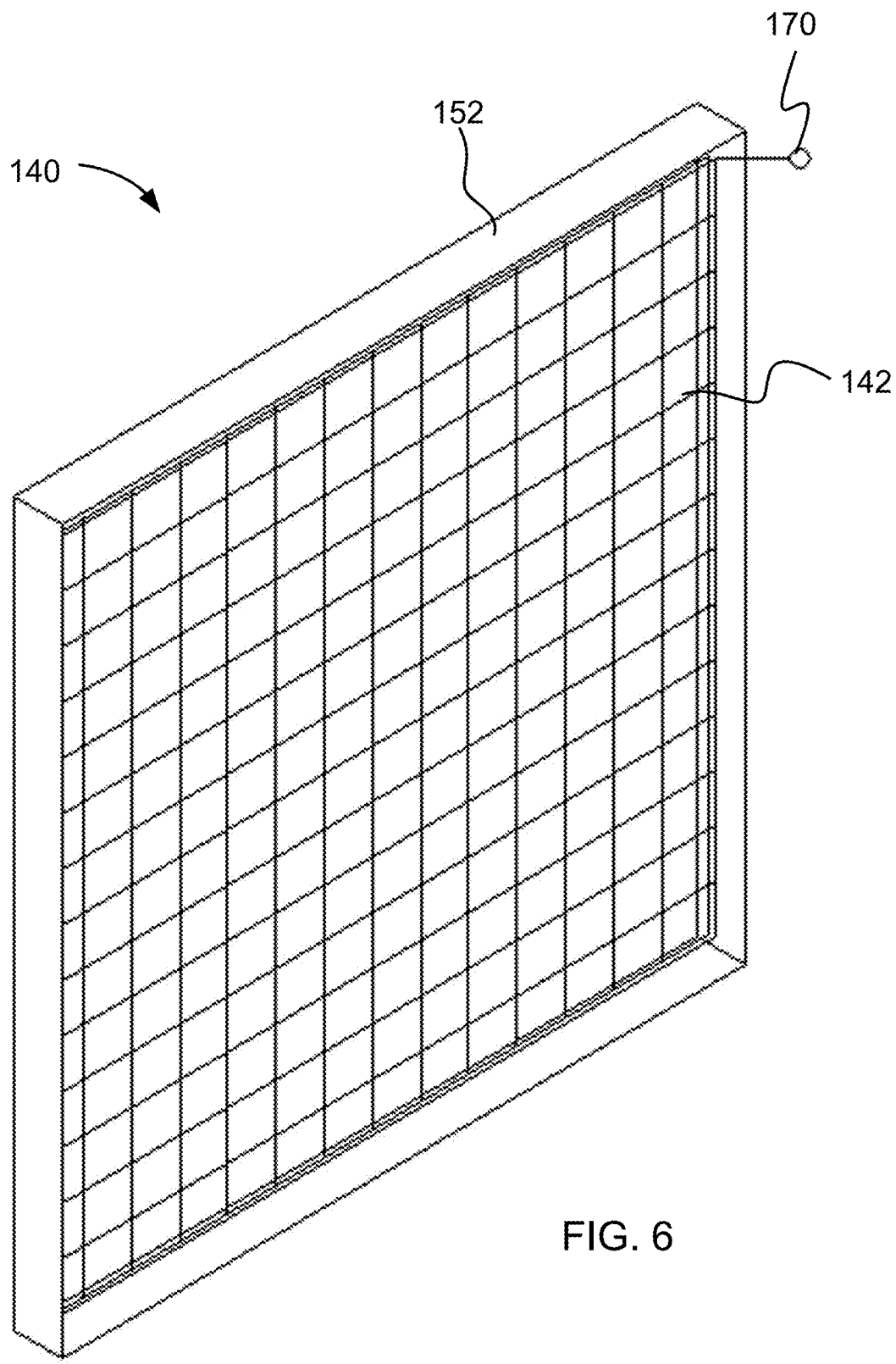
FIG. 6 illustrates a perspective view of a schematic diagram of an embodiment of an ionizing filament grid including filament mesh, which may be connected to a bias power supply.

In some embodiments, as illustrated in FIGS. 3 and 4, a single row of filaments 142 may be provided, wherein the filaments may be substantially parallel having relatively similar distances "$D_f$" between the filaments. However, it may be appreciated that the distance "$D_f$" between the filaments may vary along the length of any given filament pair. FIG. 5 illustrates an embodiment where the filaments 142 of the grid 140 are not straight but exhibit a zigzag pattern. It may be appreciated that other patterns or geometries may be utilized as well, such a sinusoidal pattern, a square wave pattern, a sawtooth pattern, etc. In the illustrated embodiment, the power supply 146 is an RF power supply; however, other power supply sources may be provided. FIG. 6 illustrates an embodiment where the filaments 142 of the grid 140 exhibit a mesh pattern, or a criss-cross pattern. While the filaments 142 are illustrated as crossing at approximately 90° angles, it may be appreciated that the filaments 142 may cross at angles from 1° to 179°, including all values and ranges therein. Again, in this embodiment, the power supply 146 is an RF power supply as illustrated; however, other power supply sources may be provided. Filament grids 142 of these embodiments may produce more current resulting in an increase of RF or DC pulse power emitted into the metal vapor plasma stream when the grids are connected to RF or DC pulse power supplies. Such increase may result in an increase in plasma heating and ionization rate of the magnetron sputtering flow.

Figure 7:
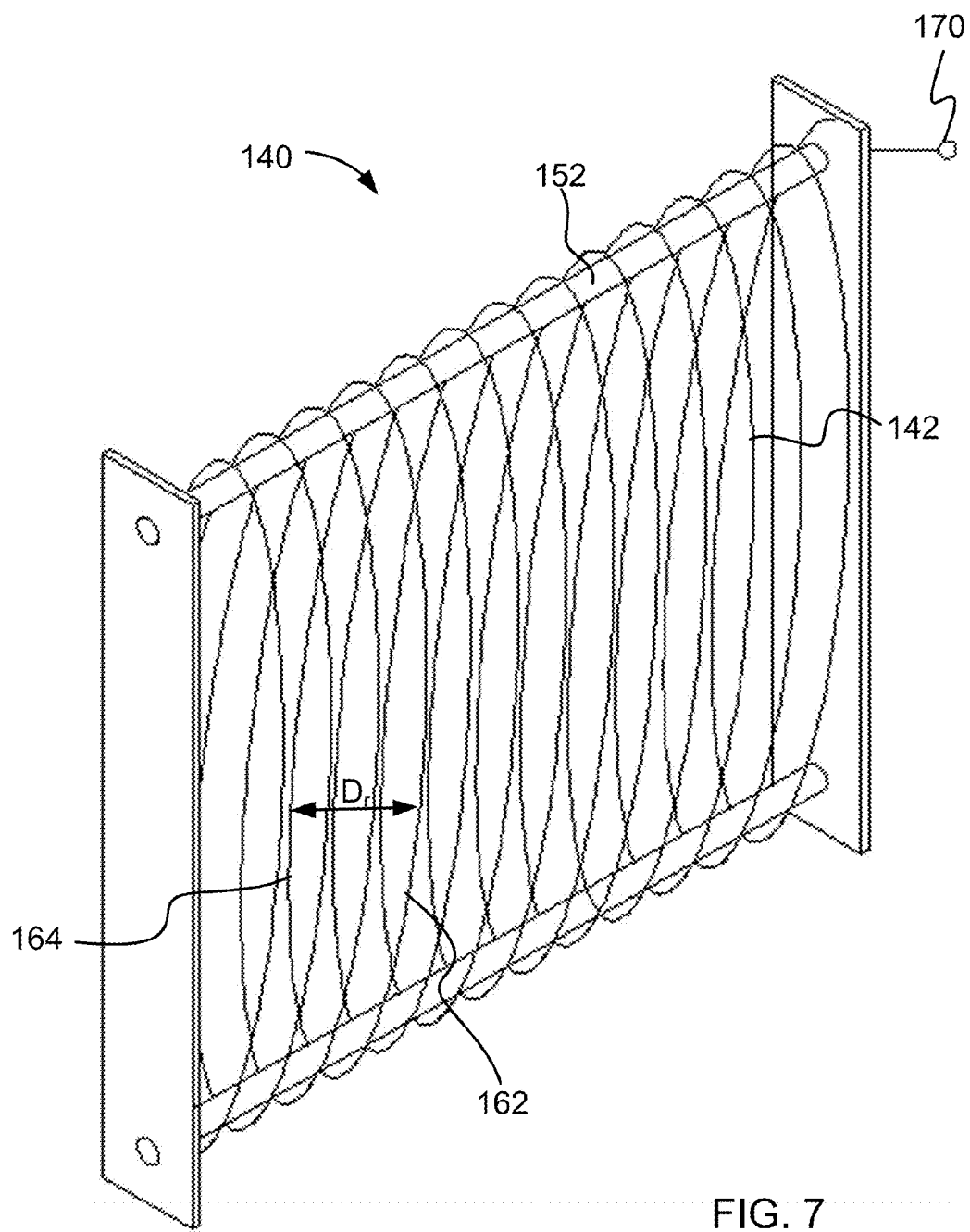
FIG. 7 illustrates a perspective view of a schematic diagram of an embodiment of an ionizing filament grid with a double layer of ionizing filaments.

In other embodiments, such as illustrated in FIG. 7, two or more rows 162, 164 of filaments 142 may be provided. The layers or rows may be relatively parallel to the target surface and immersed in the plasma discharge zone. The distance between neighboring rows "$D_r$" 162, 164 may be in the range of 1 to 10 times the thickness of the plasma sheath formed by the individual filaments when a bias voltage is applied to the filament grid 140. In one embodiment, neighboring rows may be spaced at a distance of 1 mm to 600 mm apart, including all values and ranges therein.

Figure 8:
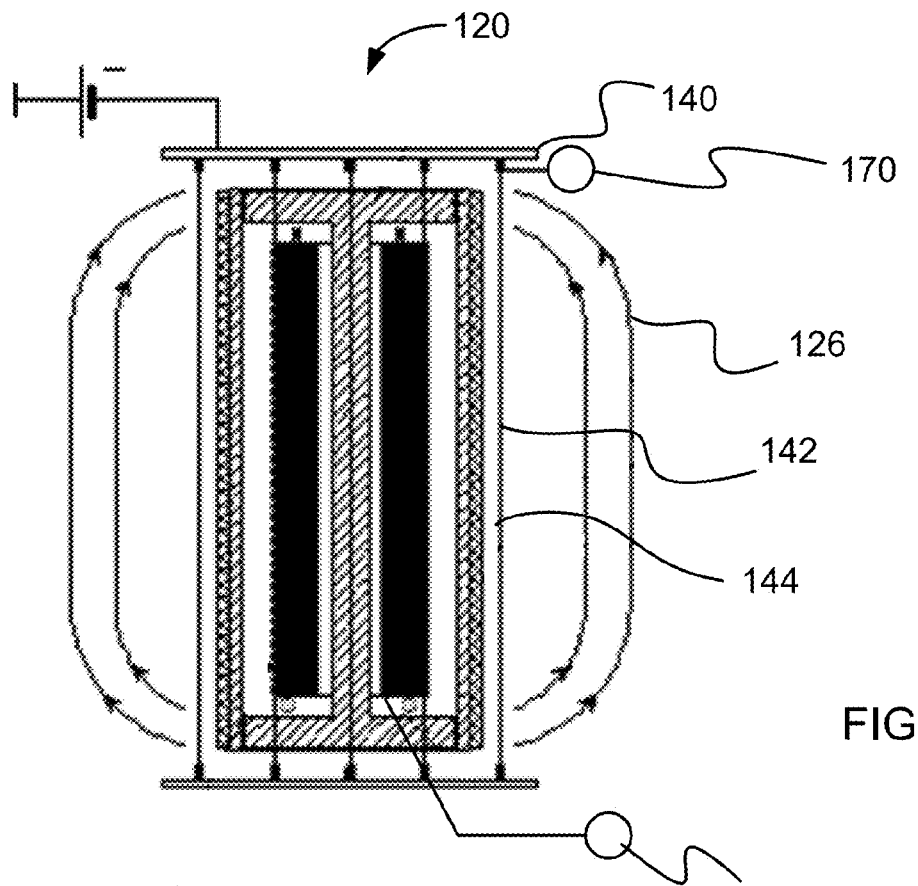
FIG. 8 illustrates a cross-sectional side view of a schematic diagram of a cylindrical magnetron including ionizing filaments.
Figure 9:
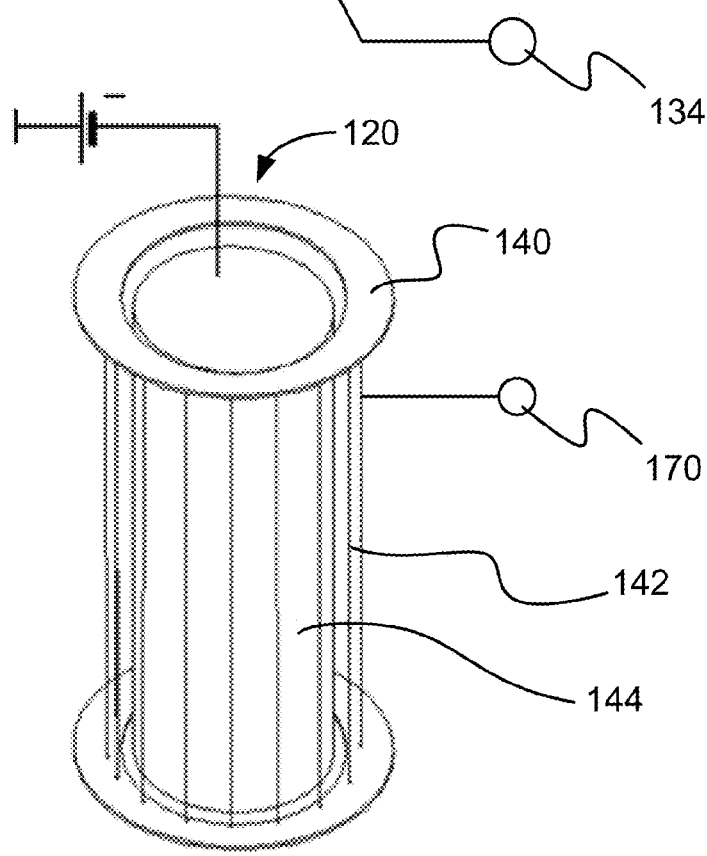
FIG. 9 illustrates a perspective view of a schematic diagram of a cylindrical magnetron including ionizing filaments.

In yet a further embodiment, such as that illustrated in FIGS. 8 and 9, a circular magnetron 120 may be provided, having a cylindrical magnetron target surface 144. The magnetic field 126 may run parallel to the surface 144 of the target 122, up and/or down the length, depending on the magnet orientation. The filament grid 140 may be provided around the circular magnetron 120, wherein the grid 140 may envelop the side of the magnetron 120. In one embodiment, the filaments may be spaced relatively evenly around the magnetron 120.

As alluded to above, the filaments 142 may be connected to at least one power supply 146 (see FIG. 1), which may provide DC, DC pulse, or RF bias and may, in some embodiments, be variable. Referring again to FIGS. 2 through 4, a bias power supply 170 (i.e., the DC, pulsed DC or RF) and a heating power supply 172 may be connected to the filament grid 140. The heating power supply 172 may heat the filaments to the thermionic emission temperature of the filaments 142. Thus, the filaments 142 may provide either or both thermionic emission due to heating of the filaments and secondary emission due to ion bombardment of the filaments 142.

The bias power supply may provide a DC bias of 10 to 200 V (including all values and ranges therein) and 1 to 1000 amperes (including all values and ranges therein) to the filament grid 140. In addition, the DC pulse or high frequency (HF) power supply 170 may be used for ionization of metal sputtering vapor instead of a DC bias power supply. Regardless of the type, the power supplies may be variable. The DC pulse or high frequency (HF) power supply may have a frequency ranging from low frequency (LF) of 10 Hz to 10 kHz (including all values and ranges therein) or medium frequency (MF) ranging from 10 KHz to 1 MHz (including all values and ranges therein) to RF ranging from 1 MHz to 500 MHz (including all values and ranges therein) to microwave (MW) frequencies ranging from 500 MHz to 10 GHz (including all values and ranges therein). Using DC pulse, or high frequency (HF) power supplies (either LF, MF, RF or MW) can increase the ionization efficiency by heating the electrons and/or ions in ionizing discharge plasma.

In general, a negative bias may be applied to the filament grid positioned in the relatively high metal flow. The filament grid may then become a cathode. Thermionic discharge may be ignited between the filament grid and an anode. The anode may be placed anywhere within the process chamber (102, see FIG. 1), such as between the cathode and the substrate, between the sputtering target and the cathode, along the plasma chamber wall, or the anode may be the process chamber 102, etc. Optionally, additional ionizing plasma source such as hollow cathode or thermionic filaments can be added to the chamber layout to increase ionization of the gaseous plasma environment. In some embodiments, the value of the bias potential applied to the filaments 142 may be greater than the electron energy associated with the maximum of ionization cross-section of the metal vapor. The first ionization potential of the most metal atoms does not exceed 10 eV while it can reach up to 20 eV for gaseous atoms and molecules as illustrated in Table 1 below.

TABLE 1

The first ionization potential of a few metal atoms and common gas atoms.

| Atom | Al | Cu | Ti | Ta | Ar | O | N |
|---|---|---|---|---|---|---|---|
| Ei [eV] | 5.99 | 7.73 | 6.83 | 7.55 | 15.76 | 13.62 | 15.58 |

When relatively high DC voltage pulses or high frequency (HF) electromagnetic waves amplitudes are applied to the filament grid 140, the grid may generate pulses of energetic secondary emission electrons which may contribute to the ionization of the metal sputtering flow. The power supply and electric circuit of the filament grid 140 may be separate from that of the magnetron 120 or may be combined with the power supply of the magnetron 120. In one embodiment, the filament grid 140 may be connected to a negative terminal on a DC bias power supply to establish a gas discharge between the filament grid 140 as a cathode and a distant anode or the grounded vacuum chamber 102 (see FIG. 1).

Figure 10:
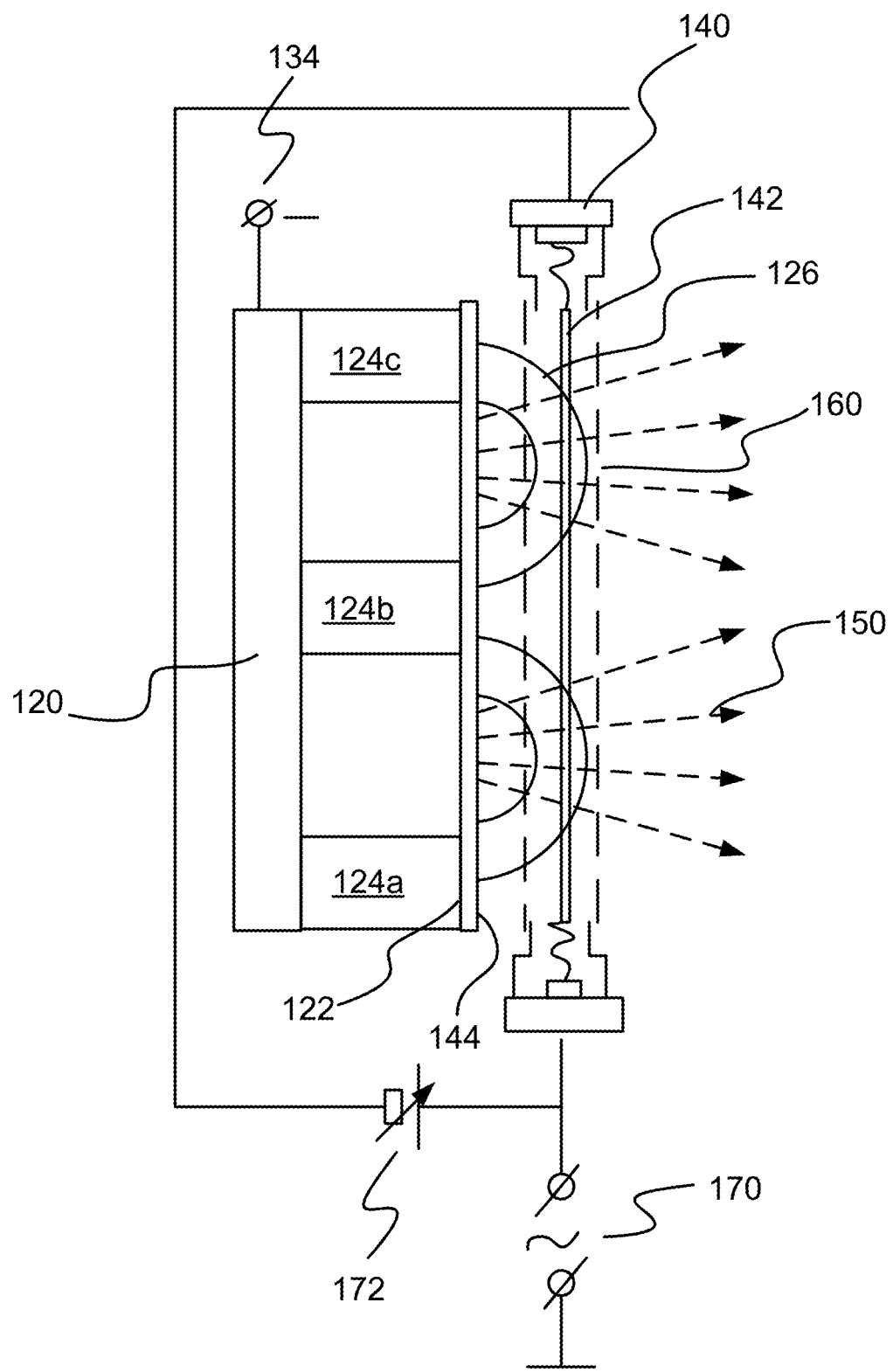
FIG. 10 illustrates a schematic view of an ionized filament grid in combination with a magnetron vapor source with DC pulse bias supplied to the filament grid.
Figure 11:
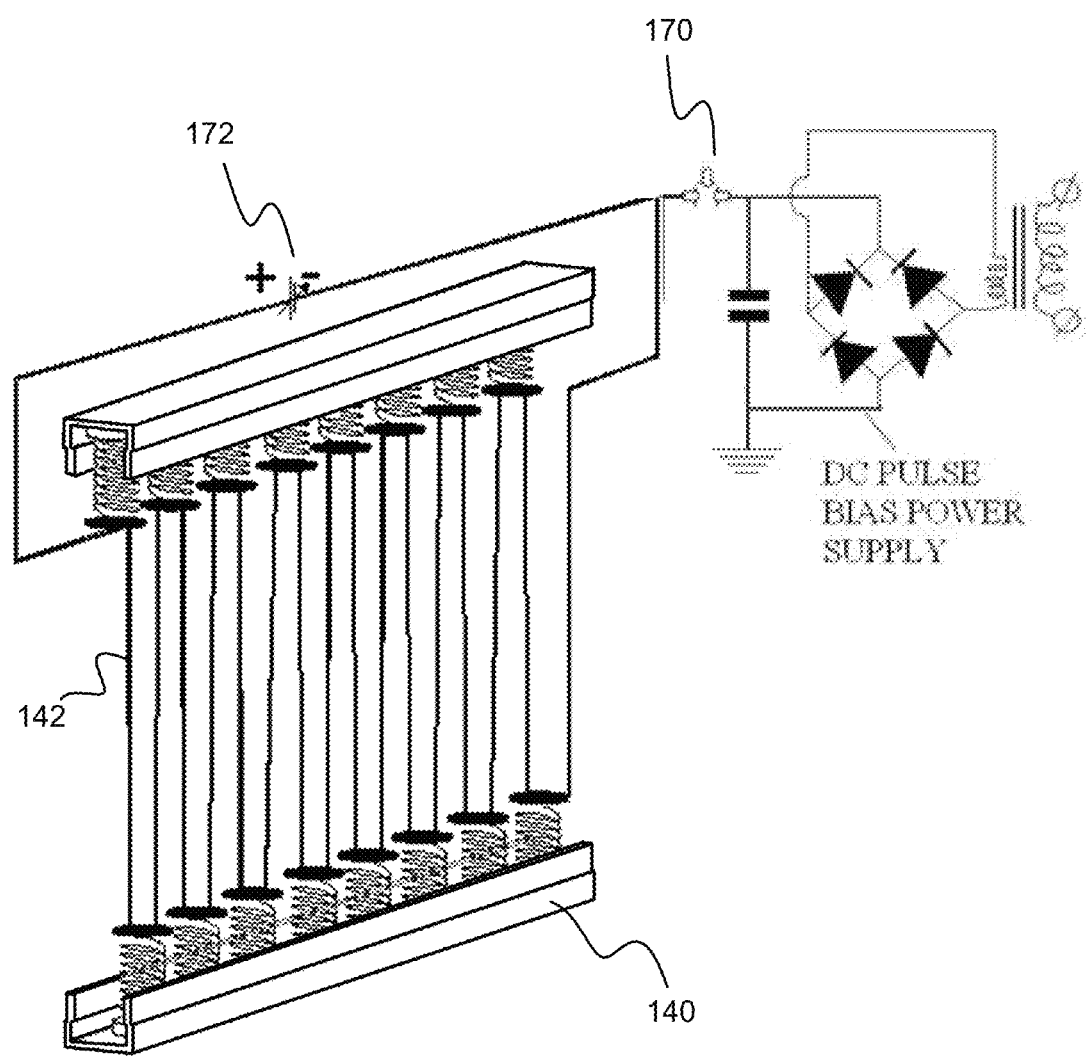
FIG. 11 illustrates a perspective view of an ionized filament grid with a DC pulse bias supplied to the filament grid.

FIGS. 10 and 11 illustrate an embodiment wherein a filament grid 140 may be connected to a variable or high voltage DC pulse power supply 170. In this embodiment, relatively high voltage pulses may be applied to the filament grid 140 with a voltage ranging from 100 volts to 20 kV, including all values and ranges therein and a pulse time ranging from 0.1 mks to 10 ms, including all values and ranges therein as well as a duty cycle ranging from 10% to 90%, including all values and ranges therein. When HF bias (LF, MF, RF or MW) or DC pulse bias is applied to the filament grid 140, the filament grid 140 may serve as a plasma immersed antenna which may emit electromagnetic waves heating the plasma environment and increasing the ionization rate of both the metal sputtering flow and the background plasma forming gas atmosphere.

Figure 12A:
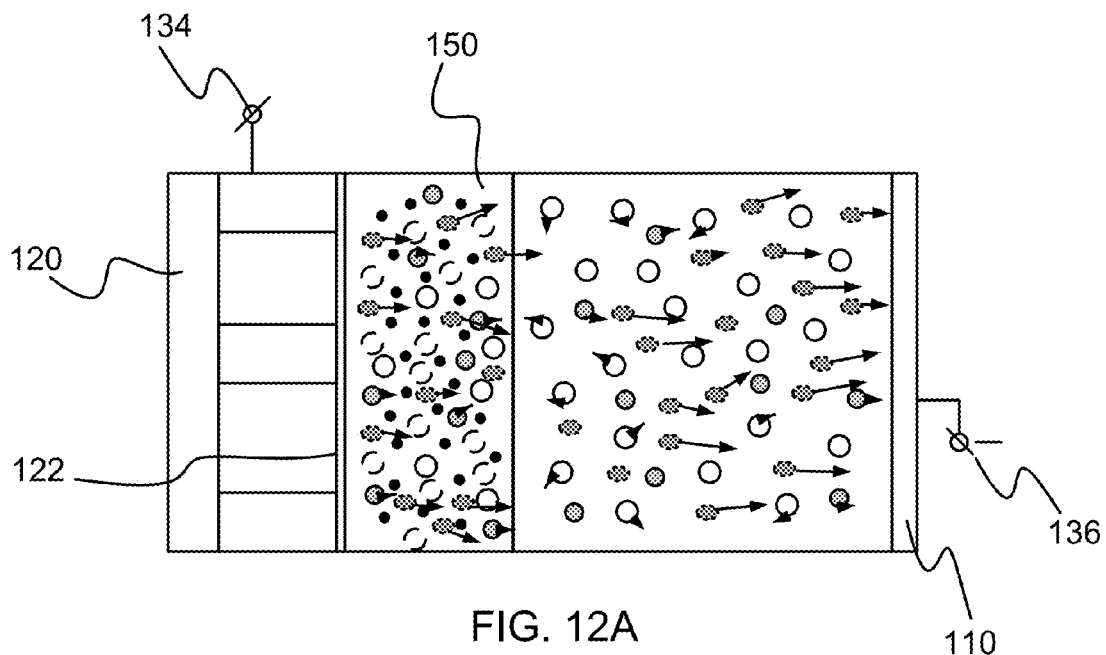
FIG. 12A is a schematic illustration of a conventional magnetron sputtering process without ionizing filaments.
Figure 12B:
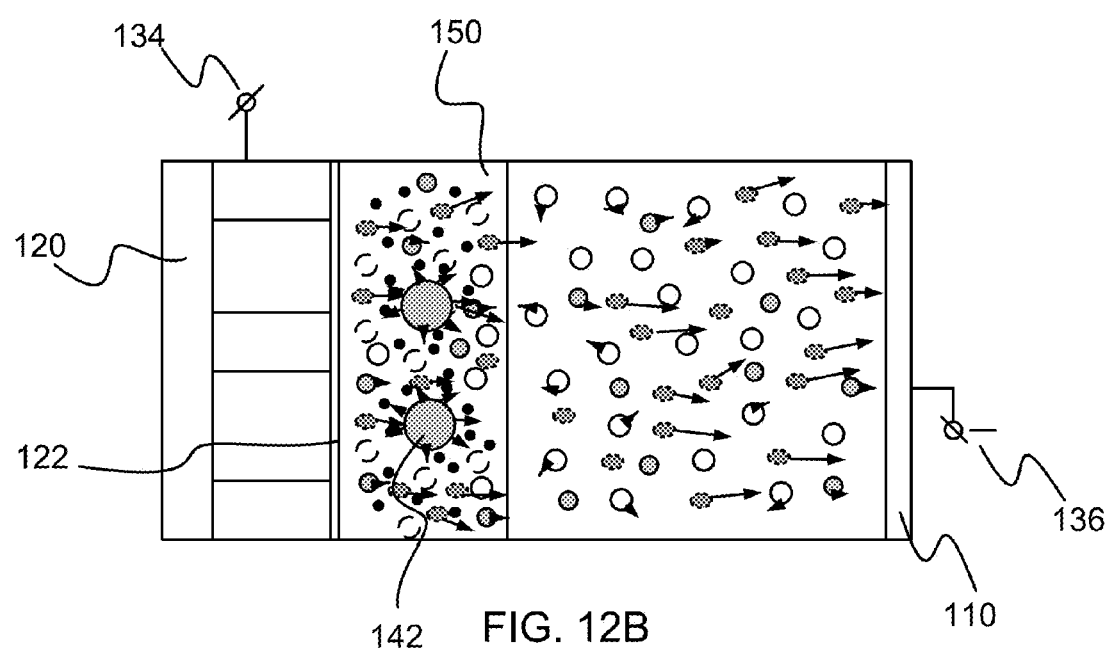
FIG. 12B is a schematic illustration of a magnetron sputtering process with ionizing filaments.

A schematic illustration of the magnetron sputtering process with and without an ionizing filament grid, represented by filaments 142, is illustrated in FIGS. 12A and 12B, respectively. Atoms of an inert gas, such as Ar atoms (represented by the white circles with solid lines) and ions (represented by white circles with broken lines), may have thermal velocities corresponding to a gas temperature of about 300° C. Other inert gases such as Kr, Xe or Ne can be also used for sputtering of metal atoms and their temperatures can range from 100° C. to 3000° C., including all values and ranges therein. These inert gas particles may move relatively slowly in randomly oriented directions, which may allow the inert gas atoms and ions to stay in the magnetron dense plasma discharge zone 150 for relatively long durations. The metal sputtering atoms (illustrated by the gray circles with solid lines) may exhibit kinetic energy ranging from 1 eV to 10 eV, including all values and ranges therein, and may cross the discharge zone 150 toward a substrate 110 to be coated with ten times greater speed than the argon atoms and ions. Thus, a lower probably of ionization of metal atoms versus argon atoms via electron-atom collision may occur in the magnetron dense plasma zone 150.

Inserting a negatively-biased (cathodic) ionization filament grid 140 into the magnetron plasma discharge zone 150 may provide an independent source of energetic electrons (black circles), which may increase the ionization of the metal sputtering flow forming metal ions (represented by the grey circles with broken lines). In addition, the plasma heating, applied to the filament grid may increase the electron and/or ion temperature resulting in an increase of ionization rate of both metal sputtering atoms and gaseous atoms and molecules via electron collisions.

The ionization rate $n_i/(n_i+n_a)$ of atomic metal-gaseous environment, where $n_i$ and $n_a$ are densities of ions and neutral atoms in plasma respectively, due to direct collisions with electrons in plasma discharge can be estimated by the following equation (Eqn. 1):

$$n_i/(n_i+n_a)=k_{ea}n_e n_a, \qquad \text{Eqn. 1.}$$

where $n_e$ and $n_a$ represent the density of electrons and atoms, respectively, and $k_{ea}$ is the ionization constant, which depends on energy distribution of electrons in the plasma. The ionization rate and ionization constant increase with higher electron temperature or electron energy. As illustrated above, ionization rate may be improved by increasing the density of electrons in the area where electrons are interfacing the metal-gaseous flow. The ionization rate may also be increased by increasing the energy of ionizing electrons. When energetic electrons collide with metal atoms it increases the ionization rate of the metal vapor flow. The concentration of the electrons may be increased by using the hot thermionic filament grid as a metal electrode interfacing the metal vapor plasma. As noted above, the thermionic filaments may be formed of tungsten, tantalum or other suitable metals having relatively large thermionic emission rates. Typical thermionic emission current for tungsten wire may range from 0.1 to 10 A/cm² in a tungsten wire temperature ranging from 2000° C. to 3000° C. For instance, it can reach 5.1 A/cm² at tungsten wire temperature of 2560° C. The thermionic emission current of thoriated tungsten can reach 10 A/cm² at the wire temperature of 1850° C.

When a thermionic filament grid 140 is installed in front of a magnetron target 122, the metal sputtering flow may consist of relatively fast energetic metal atoms having energy ranging from 1 eV to 10 eV, including all values and ranges therein, such as 1 eV to 5 eV, which may interact with the thermionic filaments 142. Sputtered metal atoms may impact the thermionic filaments and, at temperatures of above 2000° C., the metal atoms may stick to the filament and then re-evaporate having a thermal energy not exceeding the temperature of the filaments. A cloud of metal vapor in front of the magnetron target may result, which may then be ionized in magnetron discharge in the same manner as other neutral gases such as argon. That is, when the re-evaporated (vaporized) sputtering atoms collide with ions of the same metallic elements a resonance charge-exchange may result and increase the ionization rate of the sputtered metal atoms. The resonant charge transfer ionization reaction may be presented by the following expression, (Eqn. 2):

$$A_s + A_T^+ \rightarrow A_s^+ + A_T \qquad \text{Eqn. 2}$$

where $A_S$ and $A_T$ are fast sputtering metal atoms having energy ranging from 1 to 10 eV and thermalized atoms having energy of ~0.1 eV of the metal vapor atoms re-evaporated from the hot thermionic filaments, respectively. The cross-section of the resonant charge transfer collisions may reach 1E-14 cm². Taking into account that characteristic cross-sections of elastic collisions between two metal atoms is on the order of magnitude 1E-16 cm² (the characteristic diameter of the atom is 1E-8 cm) one may conclude that ionization probability in resonant charge transfer collisions between metal ions and metal atoms of the same kind defined by Eqn. 2 can reach up to 100%. Therefore, the hot thermionic filament grid 140 installed near the magnetic discharge area 150 may result in a relatively substantial increase of the ionization rate of the magnetron sputtering metal atoms by generating a dense metal vapor cloud near magnetron target, even without the emission of energetic electrons. Immersing the thermionic filament grid 140 into the relatively dense plasma of the magnetron discharge zone in the vicinity of the magnetron target 122, may allow for a substantial increase in ionizing electron current and deliverance of electrons to the area where the density of the metal sputtering atoms may be high. Further, re-evaporation of the metal sputtering atoms may create a cloud of metal vapor in front of the magnetron target. The ionized metal vapor in the magnetron discharge zone may then serve as media for ionizing the sputtering metal atoms via resonant charge transfer reactions.

Figure 13:
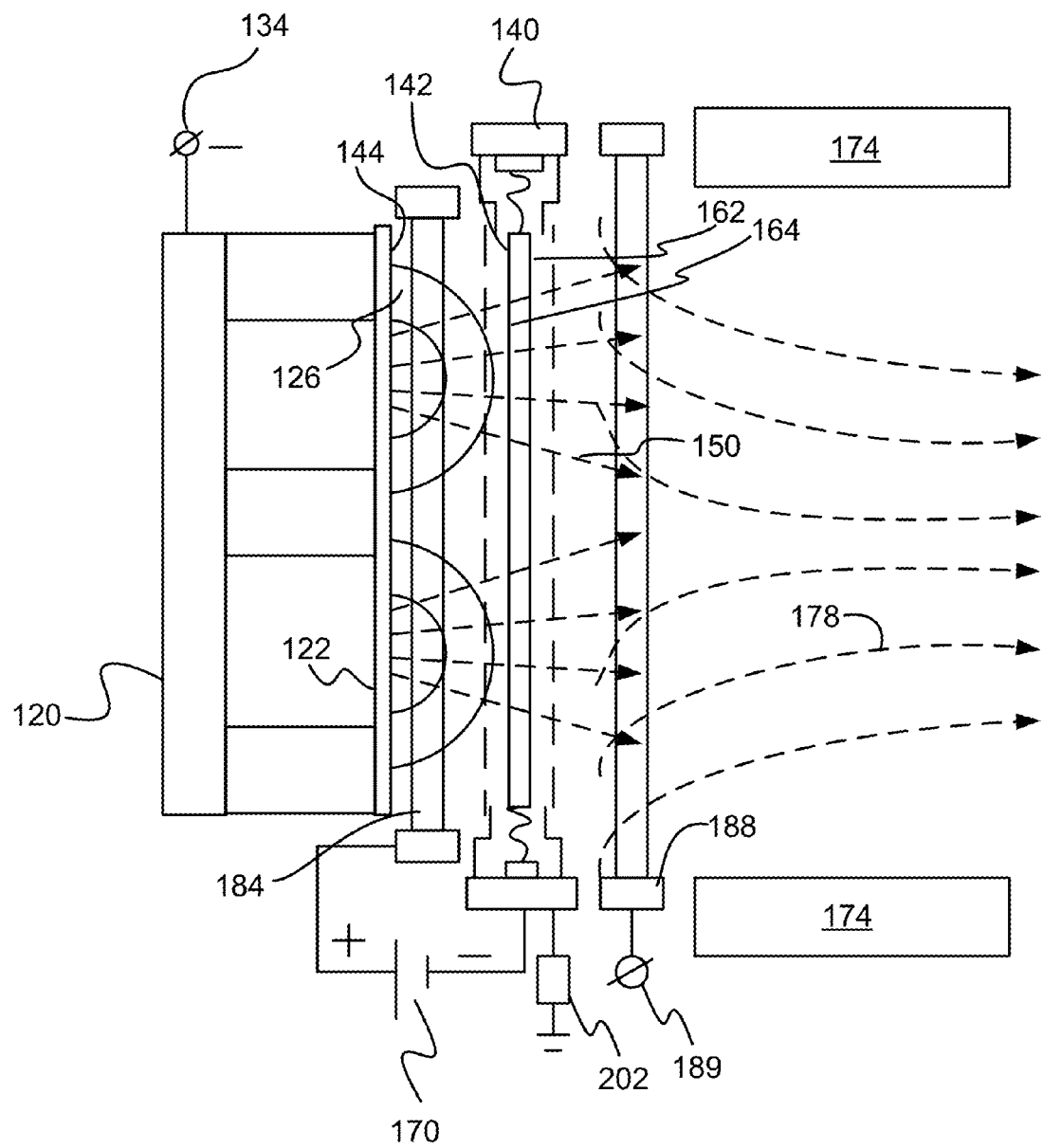
FIG. 13 illustrates a schematic cross-sectional view including a double layer thermionic filament grid, a grid anode and an additional double layer ionizing filament grid connected to an RF power supply in combination with a magnetic coil.

In a further embodiment, illustrated in FIG. 13, a magnetic coil 174 may be used in combination with the thermionic filaments. The magnetic coil 174, as illustrated, is tubular; however, other geometries are contemplated and may be dependent on the size and shape of the magnetron target 122. In this embodiment, the filament grid 140 also employs one or more layers 162, 164 of filaments 142, which may be positioned substantially parallel to the target surface 144 and immersed in the magnetron plasma discharge zone 150. The ionization rate of the metal-gaseous plasma 150, which may exceed 10%, may allow for the use of a focusing magnetic coil 174 in front the filament grid 140, i.e., with reference to the filament grids 140. The magnetic coil 174 may be positioned opposite to the target surface 144 from the filament grid 140 and may generally exhibit a magnetic field 178 perpendicular to the target surface 144 and parallel to the inner surface of the magnetic coil 174. The magnetic coil 174 may provide for the manipulation or focusing of the ionized magnetron sputter vapor flow 176 to control the density of the metal-gaseous plasma 176 deposited on substrates 110 that may have a relatively large area and/or complex shapes. A filament grid anode 184 may be provided between the thermionic ionizing grid 140 and the magnetron 120, wherein the filament grid anode may be generally parallel to the thermionic ionizing grid 140 and/or the magnetron target surface 144. In addition, a RF antenna 188 may be provided between the thermionic ionizing grid 140 and the magnetic coil 174. The RF antenna may be coupled to an RF power supply 189. The RF antenna may also include a single or double layer filament grid, which may be generally parallel to the target surface 144.

Figure 14:
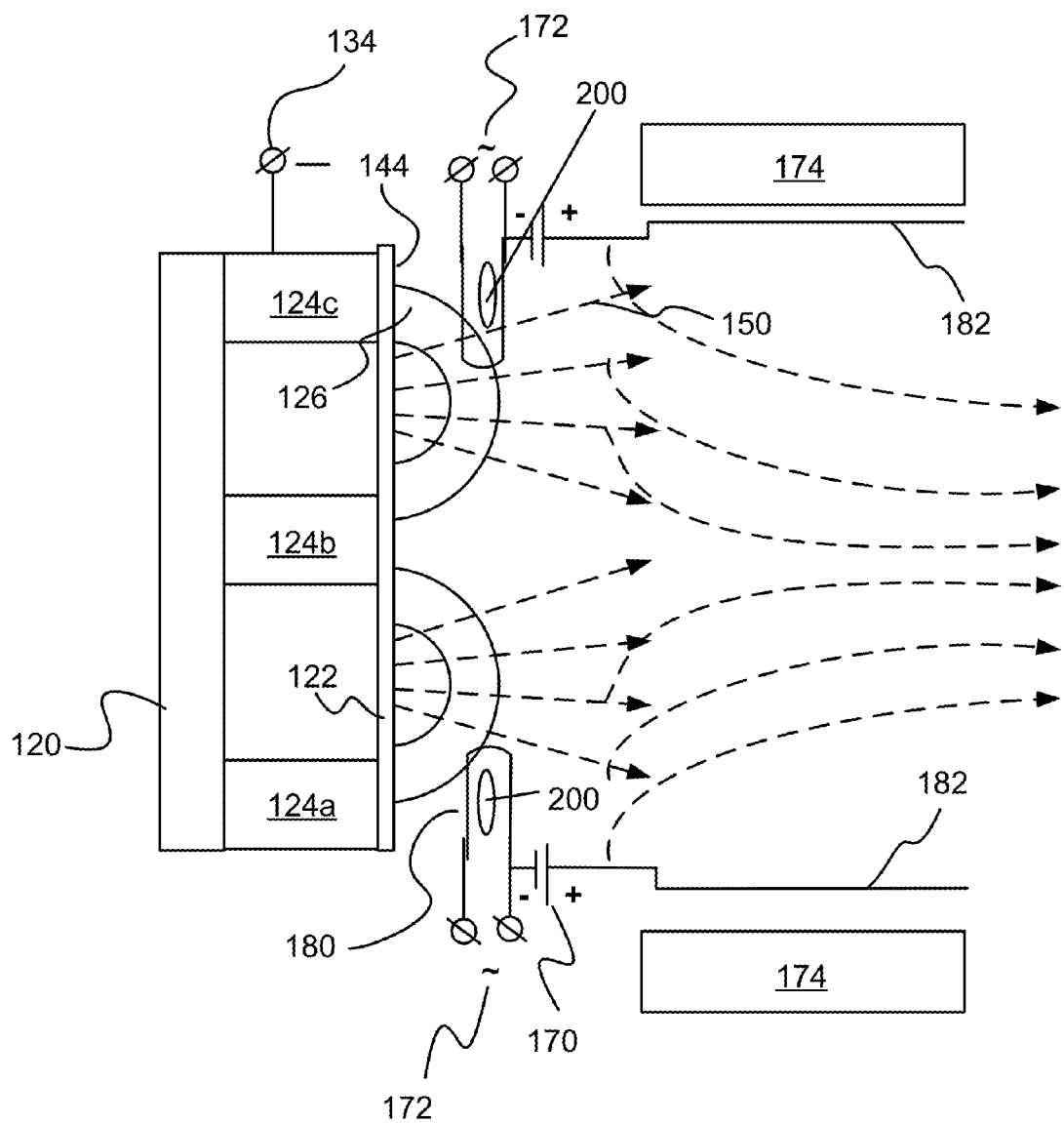
FIG. 14 illustrates a schematic cross-sectional view of U-shaped ionizing filaments and a tubular anode co-axial with a magnetic focusing coil.

In additional embodiments, as illustrated in FIG. 14, the ionizing filament grid 140 may be formed from filaments 180 generally exhibiting a "U" shape. Again, the filaments 180 may be thermionic and connected to a heating power supply and/or a plasma discharge power supply. The filaments 180 may be positioned around a portion of or around the entire perimeter of the target surface 180, wherein U shape of the filaments 180 may generally be perpendicular to the target surface and the legs of the "U" form two layers of filaments parallel to the target surface 122. The distance "$D_f$" between the individual "U" shaped filaments 180 at their base near the holder 152 of the grid 140 may be similar to that described above, in the range of 1 mm to 100.0 mm, including all values and ranges therein. Furthermore, the distance between the legs of the "U", may be in the range of 1 mm to 200.0 mm, including all values and ranges therein. A distance between the filaments less than 1 mm may be impractical as it may result in a short circuit due to thermal expansion and thermo-mechanical deformation of the filaments. A distance between filaments more than 200 mm may reduce the ionization efficiency of the filament grid since most of the metal flow will pass the grid without being ionized by thermionic electrons. An anode 182 may be positioned co-axially with a focusing magnetic coil 174, which may oppose the target surface 144 relative to the thermionic cathode filaments 180. For example, as illustrated, the anode 182 is tubular; however, other geometries may be exhibited, which may depend on the shape of the target 122. The anode 182 may also be positioned around a portion of or around the entire perimeter of the target surface 144. The thermionic cathode filaments 180 may be connected in series to the heating power supply 172.

The thermionic filament grid 140 may again be at least partially immersed in the relatively high metal flow density of the magnetron discharge plasma 150. In some embodiments, the ionizing thermionic discharge may be ignited between the cathodic "U" shaped thermionic filaments 180, which may be connected to the negative pole of the power supply and the anode 182 may be connected to the positive pole of the thermionic discharge power supply 170.

In one embodiment, the U-shaped filaments 180 may be divided into at least two groups, wherein filaments of each group may be evenly distributed around the magnetron target. The filaments of one group, which may include cathodic thermionic filaments may be connected in series to the filament heating power supply and to the negative pole of the thermionic discharge power supply, while another group, which includes anionic filaments may be connective to the positive pole of the thermionic discharge power supply.

Thus, in operation, where the thermionic discharge may be ignited between cathodic and anodic filaments installed around the magnetron target and at least partially inserted into the magnetron discharge area, a toroidal thermionic discharge 200 may be formed in front of the magnetron target 122, overlapping the magnetron discharge 150. In such a configuration, the thermionic discharge current may circulate along the toroidal discharge area 200. The anodic filaments may also be connected in series to an additional filament heating power supply to maintain their temperature above the evaporation point of the sputtering metal atoms, contributing to the re-evaporation of the sputtering atoms and formation of the target metal atom cloud in the vicinity of the magnetron target.

In one embodiment, an alternative current (AC) thermionic discharge power supply may be used and a thermionic discharge may be ignited by connecting one group of the thermionic filaments to one pole of the AC power supply and another group of filaments to another pole of the AC power supply. When the polarity of the two groups are changing according to the oscillating voltage of the AC thermionic discharge power supply one group may become a cathodic filament grid while the other one may become an anodic filament grid. When the polarity of the discharge voltage changes, the respective polarities of these two groups of filaments change, i.e., the cathodic filaments become anodic and anodic filaments become cathodic. This may result in the generation of oscillating thermionic discharge current in a toroidal area around the magnetron target, further increasing the ionization rate of the metal-gaseous plasma. Another group of U-shaped filaments may also be placed around the magnetron target, which are connected to DC, DC-pulse, or HF power supply to provide additional high frequency heating of electrons in the magnetron discharge area without being heated to the thermionic emission temperature.

Figure 15:
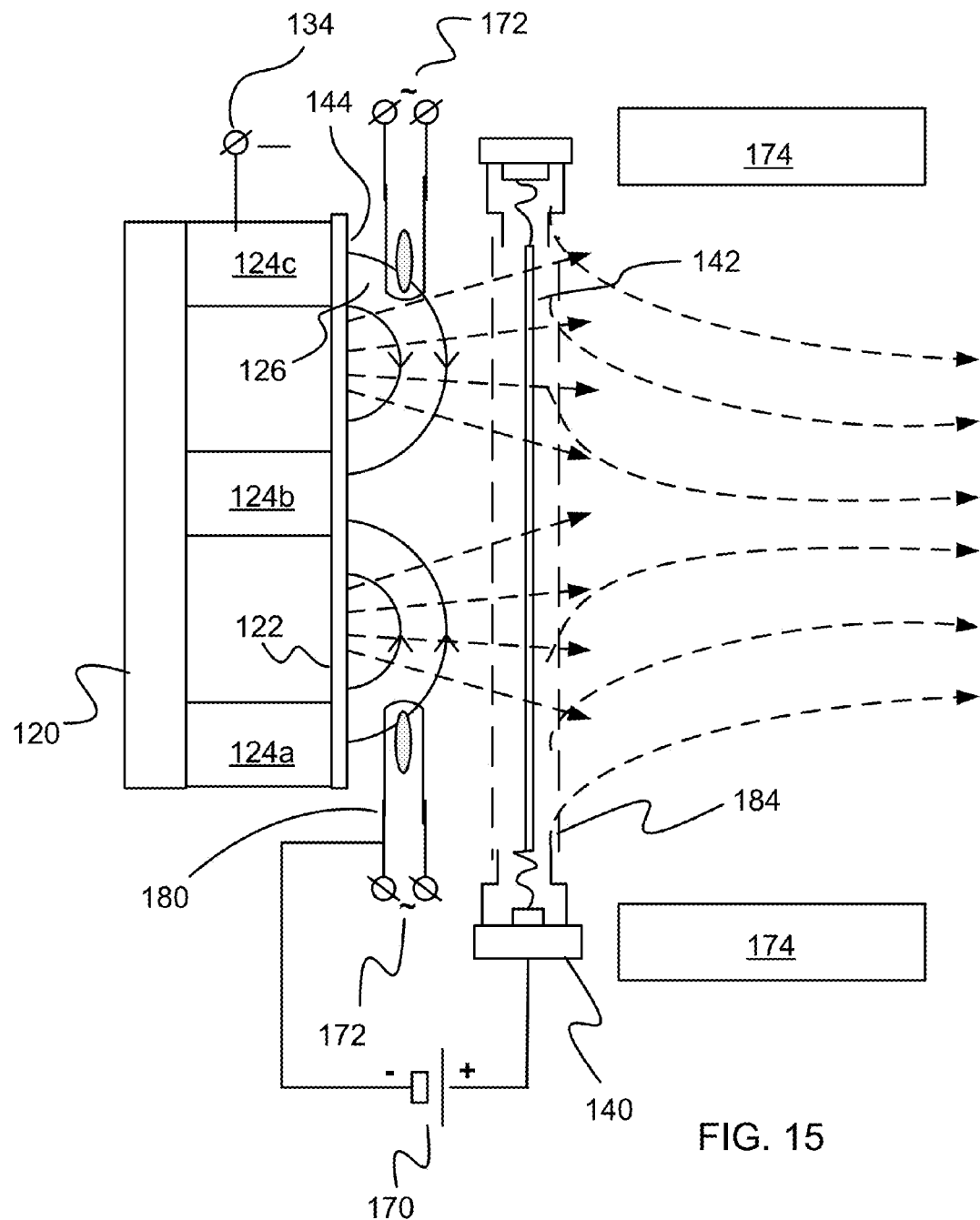
FIG. 15 illustrates a schematic cross-sectional view of U-shaped ionizing filaments in combination with an anodic bi-layer filament grid positioned between the cathodic U-shaped filaments and the magnetic focusing coil.

In another embodiment illustrated in FIG. 15, in addition to the "U" shaped thermionic cathode filaments 180, an anodic filament grid 184 may be provided between the "U" shaped thermionic cathode filaments 180 and the magnetic coil 174. When the cathodic filaments 180 are heated to the thermionic emission temperature, the thermionic discharge created between the thermionic cathodic filament grid 140 and anodic filament grid 184 increases the ionization rate between the two filament grids as well as beyond the filament grids 184, 140 towards the substrates to be coated. In this embodiment, the cathodic thermionic filament grid may be grounded or connected to the ground via a small ballast resistor 202 having resistance ranging form 0.1 Ohm to 100 Ohm (including all values and ranges therein), keeping the potential of the cathodic filament grid as close as possible to the plasma potential. This may prevent sputtering of the grid and increase its durability.

Figure 16:
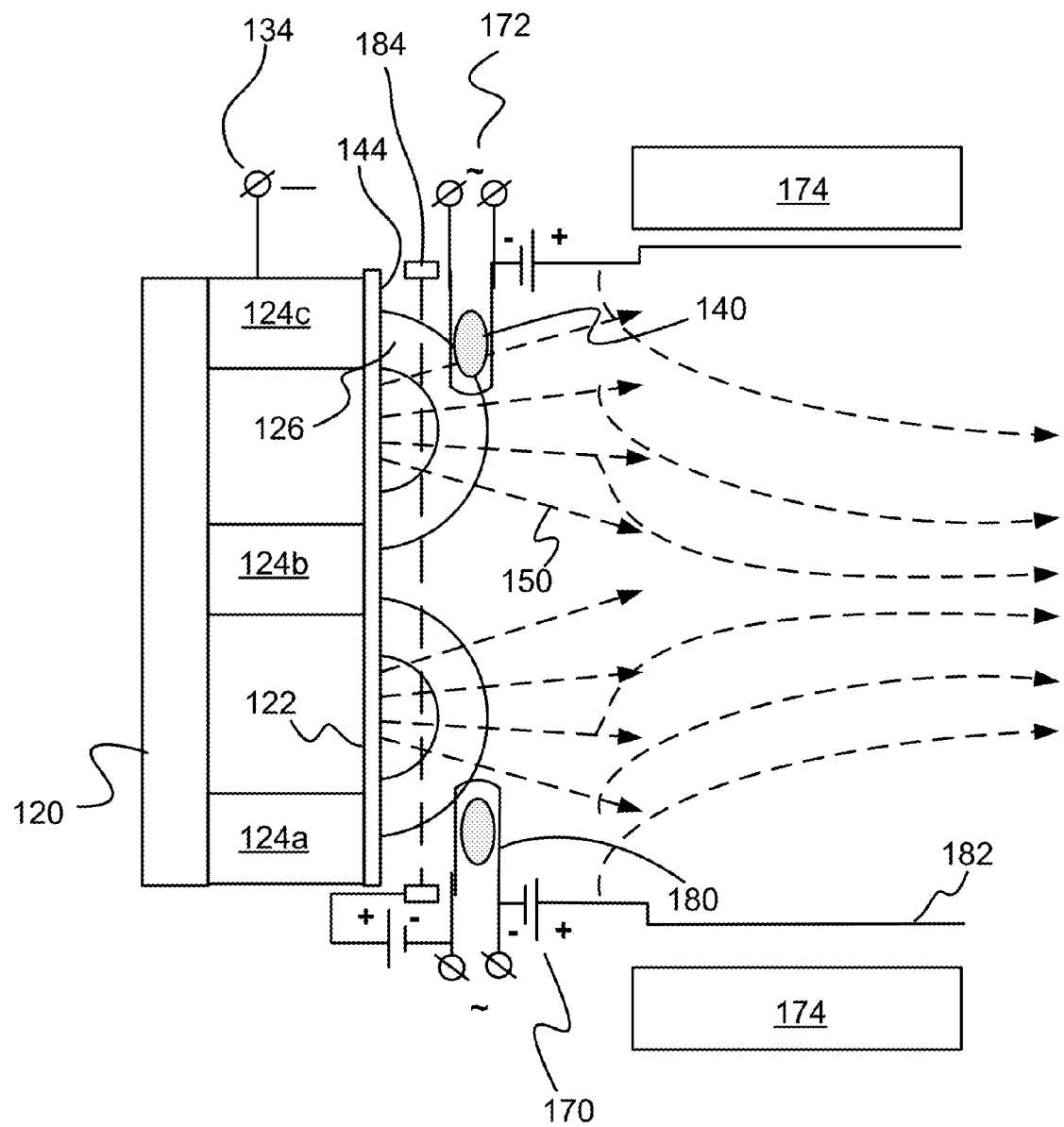
FIG. 16 illustrates a schematic cross-sectional view of U-shaped cathodic filaments in combination with an anodic filament grid.

A combination of an anode grid and a tubular anode is shown in FIG. 16, wherein the anode grid 184 is installed on one side of the thermionic ionizing grid 140 between the magnetron 120 and the thermionic ionizing grid 140. The anode grid 184 may include a plurality of filaments, which may be arranged in a mesh or parallel to each other along the plane of the grid. The anode grid 184 may also be generally parallel to the sputter target surface 144 and/or the thermionic ionizing grid 140. The tubular anode 182 is positioned on the other side of the thermionic ionizing grid 140 from the anode grid 184. Two separate power supplies may be utilized. One to bias the anode grid 184 relative to the thermionic ionizing grid 140 and one to bias the thermionic ionizing grid 140 relative to the anode 182 co-axial to the magnetic coil 174. The voltage drop between the anode grid 184 and the thermionic ionizing filaments 180 may be up to and including 500 volts, including all values and ranges therein, such as up to 400 volts, 300 volts, etc. and may be applied either as a DC voltage or as DEC pulse voltage with pulse frequency ranging from 1 kHz to 1 MHz, including all values and ranges therein, and duty cycle ranging from 10 to 90%, including all values and ranges therein. The voltage drop between the anode 182 and the thermionic ionizing filaments 180 may be up to and including 5000 V, such as up to 4,000 V, 1,000 V, 500 V, etc. Such a cascade may provide enough current of high energy electrons which may contribute to the ionization of both the metal sputtering flow and the surrounding gaseous atmosphere.

Figure 17:
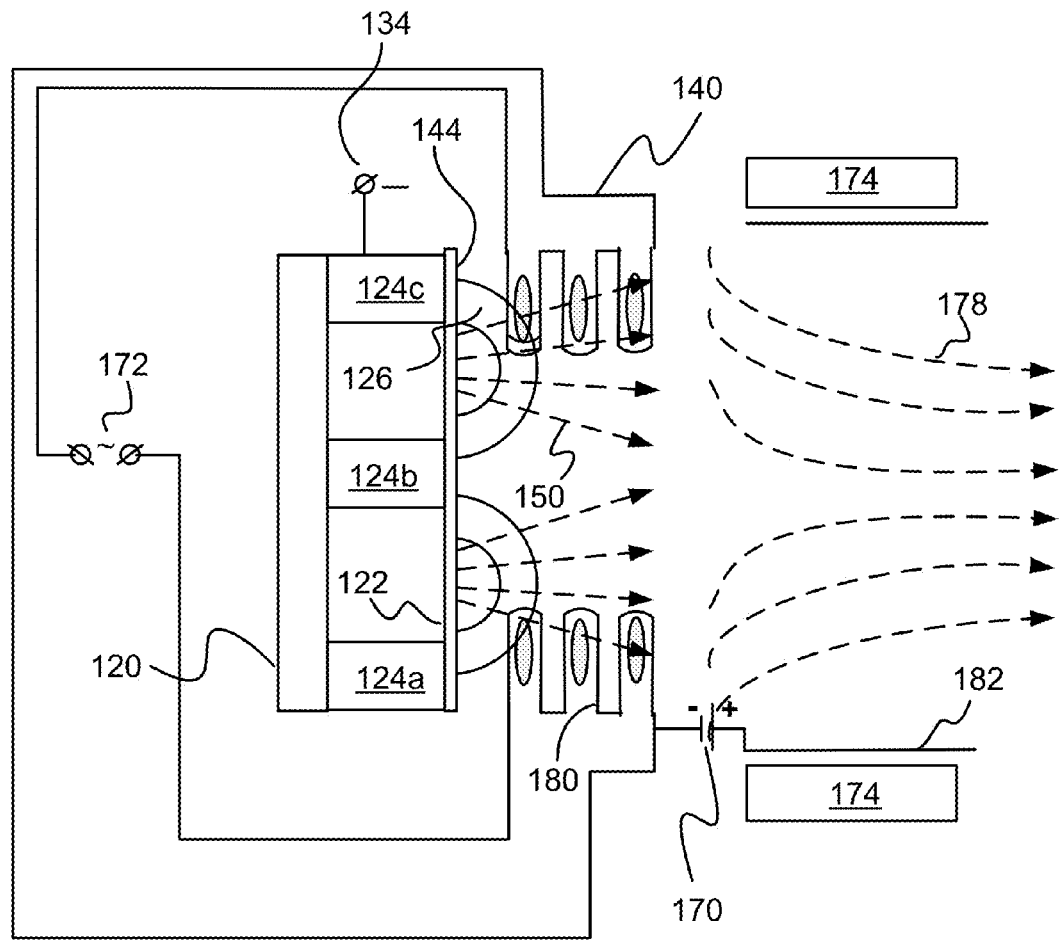
FIG. 17 illustrates a schematic cross-sectional view of a number of U-shaped cathodic filaments.

In a further embodiment, illustrated in FIG. 17, multiple layers of cathodic thermionic filaments 180 including a U-shape are installed parallel to the magnetron target 122, which may increase the thermionic discharge current and ionization efficiency of the thermionic discharge. The thermionic filaments 180 may be connected in series to one heating power supply 172 and to a bias power supply 170. A cylindrical anode 182 may be co-axial and/or co-planar to the focusing magnetic coil 174. The thermionic filaments 180 may be positioned closely enough to the magnetron target 122 to be at least partially immersed into the magnetron discharge plasma 150. The ionizing thermionic discharge may be ignited between the cathodic thermionic filaments 180 connected to the negative pole of the thermionic discharge power supply 170 and the co-axial anode 182 connected to the positive pole of the thermionic discharge power supply 170.

Figure 18:
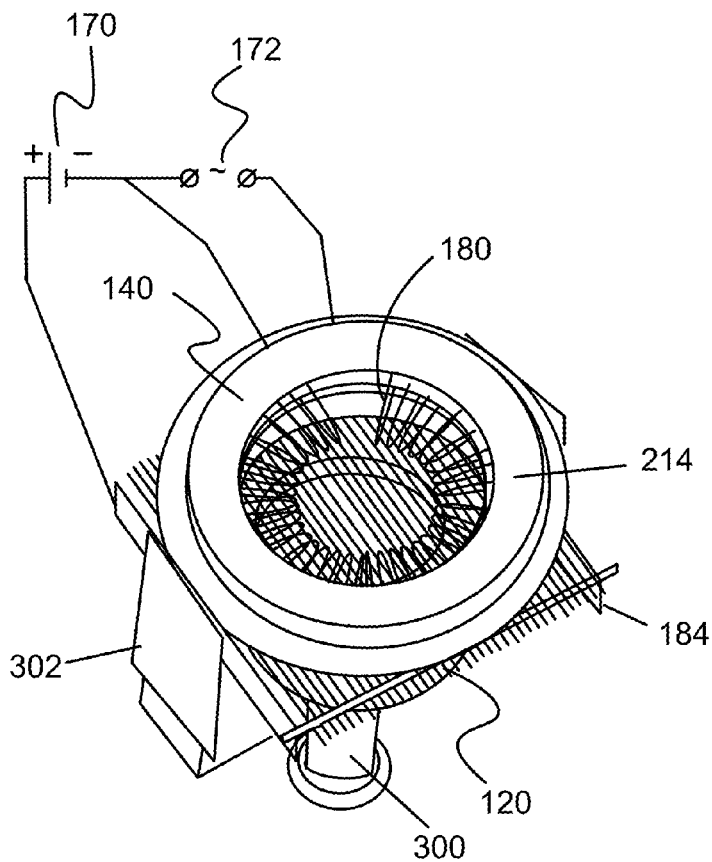
FIG. 18 illustrates a perspective view of a thermionic filament grid with a grounded anode holding disc attached to the magnetron sputtering source in an integrated assembly.
Figure 19:
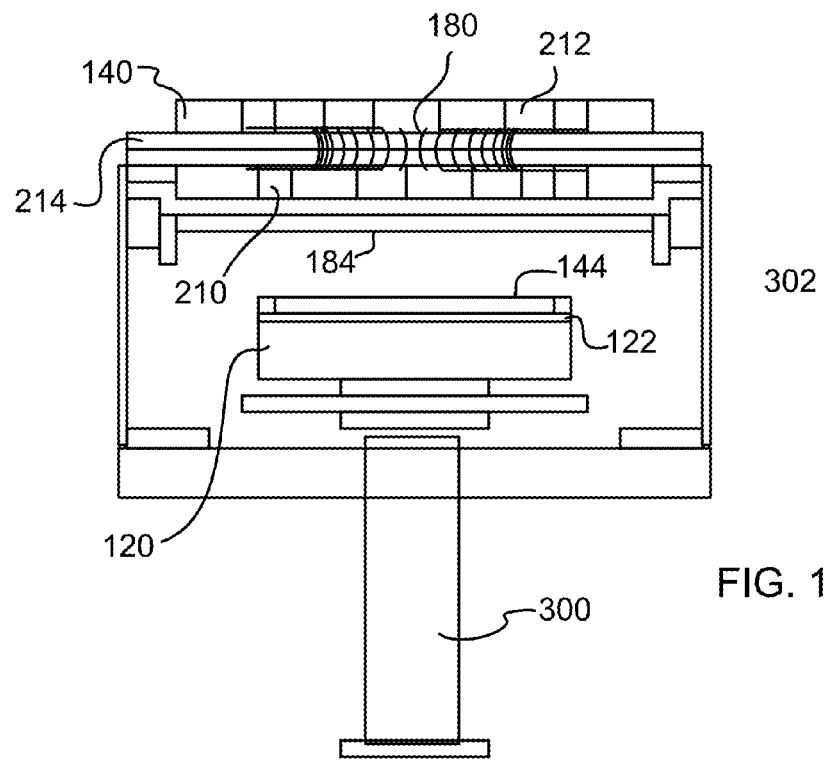
FIG. 19 illustrates a cross-sectional view of the integrated assembly of FIG. 18
Figure 20:
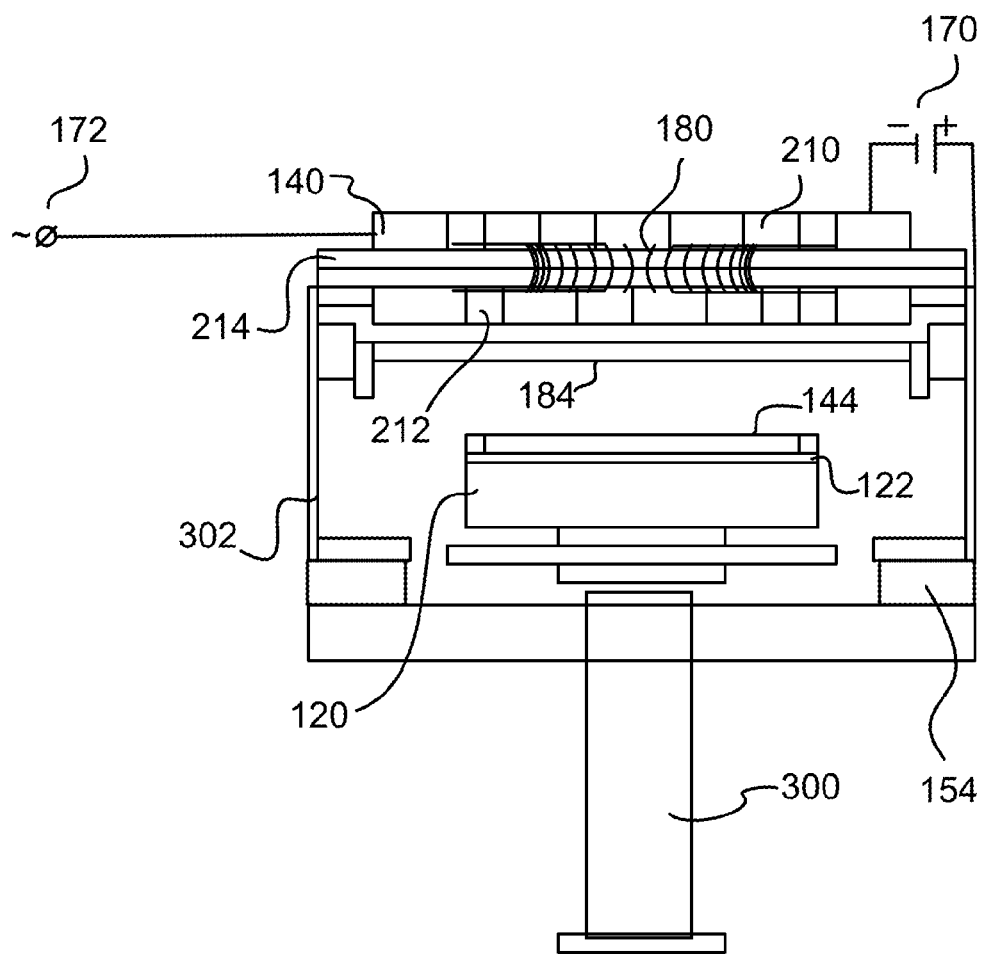
FIG. 20 illustrates a cross-sectional view of a thermionic filament grid with an isolated anode-holding disc attached to the magnetron sputtering source in an integrated assembly.

An embodiment of an ionizing filament grid including an anodic screen coupled with a thermionic cathodic filament grid and integrated into one assembly with the magnetron sputtering source is shown in FIGS. 18 through 20. A pedestal 300 may be provided by which the assembly may attach to the process chamber wall (102, see FIG. 1) for batch coating or in-line coating deposition processes. The magnetron 120 may be affixed to a distal end of the pedestal 300. In addition, a holding assembly 302 may be affixed to the pedestal 300 for retaining the ionizing thermionic grid 180 and optionally an anode, such as anode grid 184.

Figure 21:
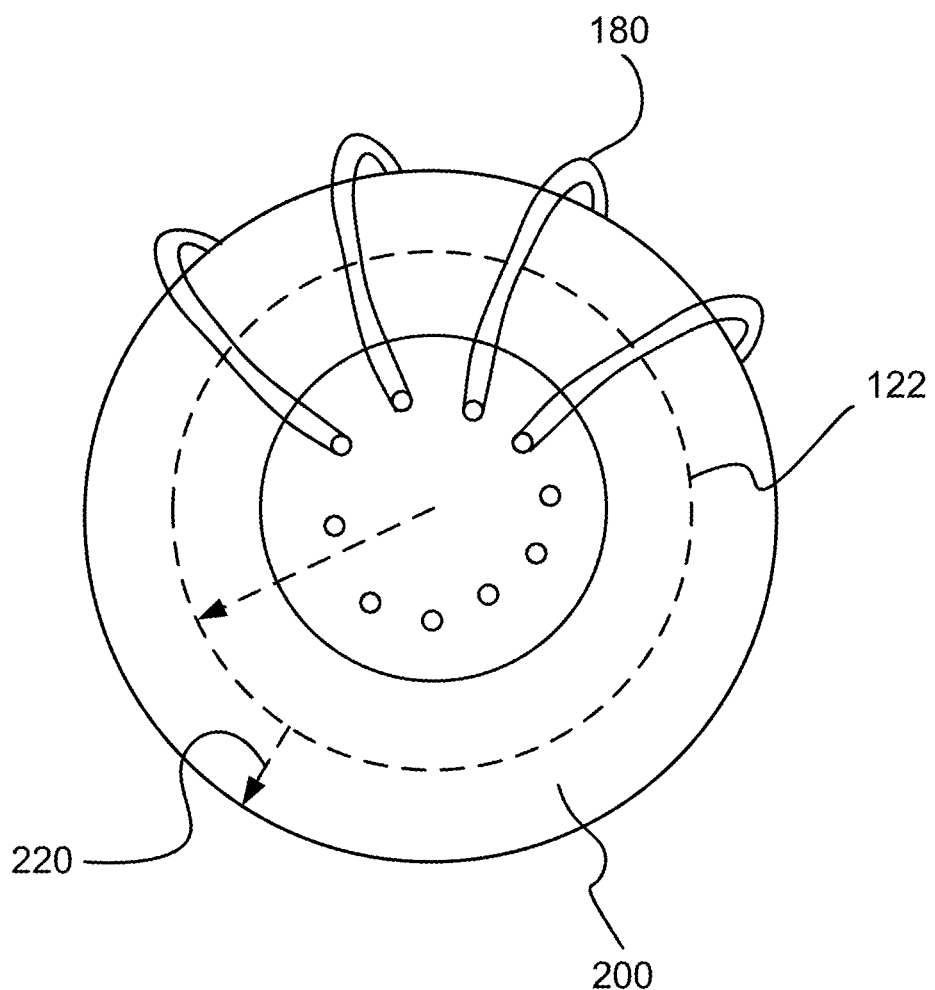
FIG. 21 illustrates a toroidal thermionic discharge area above a magnetron target.

Position of thermionic filaments 180 in a close proximity to the magnetron discharge plasma area (not illustrated) may inject thermionic electrons into the magnetron plasma where the density of metal sputtering atoms is highest as well as the re-evaporation of sputtered metal atoms, creating a cloud of metal vapor in the vicinity of the magnetron target. Both of these conditions may be favorable for increasing the ionization efficiency of magnetron metal sputtering flow as was mentioned above (see Eqn. (1) and (2)). Two sets of insulated blocks 210, 212 may be used to hold the filaments in place. The blocks 210, 212 may be made of copper or aluminum: one set of the blocks may be installed above a disc holder 214 while another set of the blocks is installed under the disc 214. The two sets of blocks 210, 212 may be shifted relative to each other by half the size of a block around the disc 214. U-shape tungsten pins 180 may be inserted into the blocks 210, 212 having one of their ends inserted into the upper block while the other end is inserted into the shifted bottom block making the plane of the U-shape pins parallel to the axis of the disc as illustrated in FIGS. 19 and 20. The U-shape pins 180 may create a toroidal thermionic discharge area 122 overlapping the magnetron discharge area while the thermionic anode disc-holder 200 is positioned inside of the toroidal discharge as illustrated in FIG. 21. The negative pole of the thermionic discharge power supply may be connected to the metal blocks holding the U-shape thermionic filaments while the positive pole is connected to the anode disc as shown in FIG. 20. Alternatively, the positive pole of the thermionic power supply can be grounded along with grounded disc-anode as shown in FIG. 19.

In operation, as illustrated in FIGS. 19-21, a thermionic discharge may be ignited between the U-shape pins 180 heated to thermionic emission temperature and disc anode 186 or anode grid 184 resulting in generation of high density plasma in a toroidal area 220 under the U-shape pin filaments 180. When this toroidal thermionic discharge area overlaps the magnetron discharge area it may result in an increase of ionization of metal sputtering flow. The filaments 180 can be heated to thermionic temperature and attached to the negative pole of the thermionic discharge power supply for igniting a thermionic toroidal discharge. The filaments may be also connected to the high frequency (HF) power supply which may result in the formation of strongly ionized HF plasma both under the U-shape filaments and in surrounding area around the filaments which will greatly contribute to increase of ionization rate of magnetron sputtering flow. The toroidal coil shown in this figure is formed by a set of U-shaped filaments installed around the magnetron target and connected to each other in series.

Figure 22:
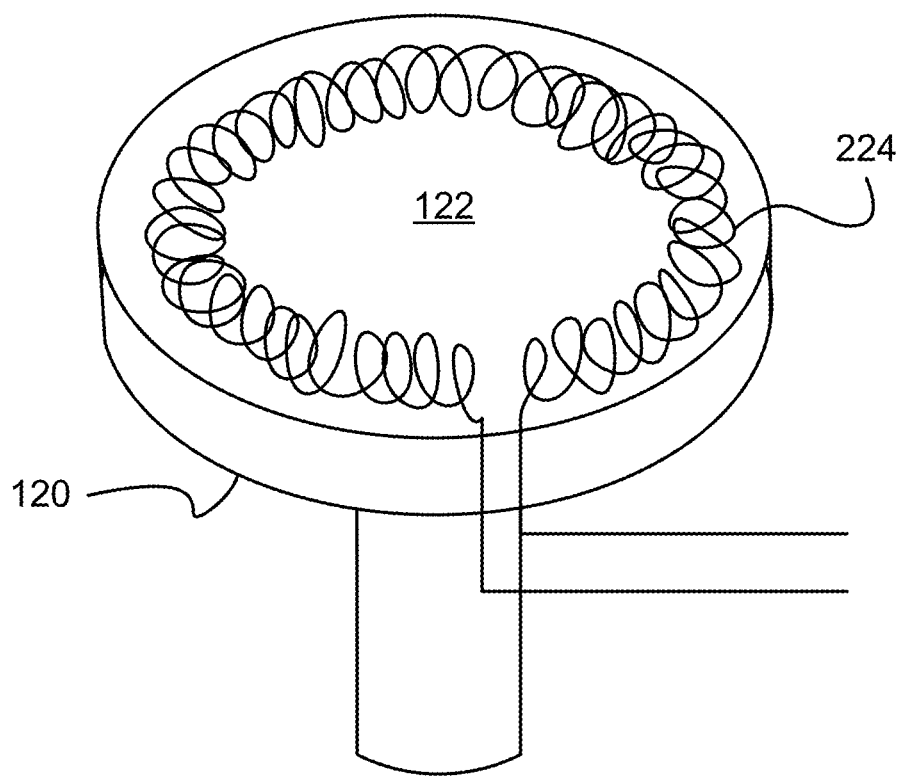
FIG. 22 illustrates an ionizing toroidal HF coil above a magnetron sputtering area.

When U-shaped thermionic filaments are connected in a series, they may form a toroidal solenoid 224 positioned above the magnetron target 122 in the vicinity of the magnetron plasma discharge area which is illustrated in FIG. 22. When the filaments are heated via an AC heating power supply, it may produce the oscillating magnetic field along the toroidal area under the U-shaped filaments. It can be used as an inductively coupled coil, which may create relatively strongly, 10% or greater, ionized plasma inside of the toroidal area or it may be powered by RF power supply to create strongly ionized plasma both in the toroidal area inside of the coil and in the area surrounding the coil. When the filaments are connected in series to the heating power supply, heated up to thermionic emission temperature and, at the same time biased by DC, DC pulse or HF power it may generate a large current of high energy thermionic electrons, which increases the ionization rate of the magnetron sputtering flow. However, it may keep the potential between the filaments and the nearby plasma environment less than 100 volts to reduce sputtering of the filaments and improve their durability.

Without being bound to any particular theory, it is contemplated that according to Faraday law such an arrangement may create azimuthal electric field having circular lines coaxial to the toroidal magnetic field of the toroidal solenoid. The electric field may contribute to heating electrons of the magnetron discharge plasma and increasing the ionization rate of the magnetron sputtering metal atoms flow. Alternatively, the RF power may be applied to the toroidal filament grid formed by the U-shaped filaments, which are immersed in the magnetron discharge dense plasma area with similar result. An increase in ionization may occur without heating the filament to thermionic temperature.

Figure 23:
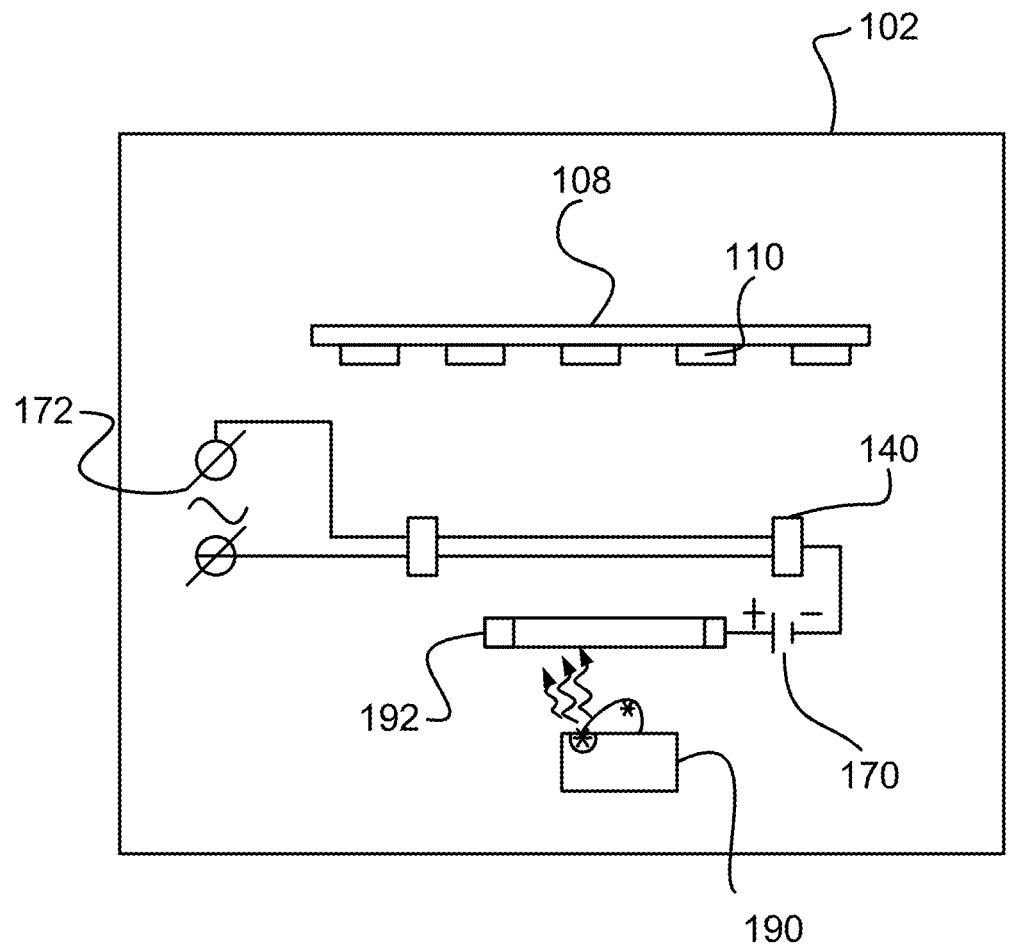
FIG. 23 illustrates a schematic cross-sectional view of a coating system with an ionized electron beam evaporator in combination with an ionizing filament grid.

As alluded to above, the metal vapor source may include a thermal evaporator, magnetron sputtering source or an injector of reactive gas containing precursors for plasma assisted hot wire chemical vapor deposition (HWCVD) process. In a further embodiment, the screen grid and ion accelerating grid can be installed in front of the ionizing filament grid for extracting and accelerating the ions produced in the thermionic discharge, converting the thermionic vapor plasma source with ionizing filament grid into wide aperture ion source. FIG. 23 illustrates an embodiment where the ionizing filament grid 140 is employed in an ionized electron beam evaporating process. The ionizing filament grid 140 is positioned between the anode 192 and the substrates 110. Initial ionization may be established by arc discharge between the electron beam crucible 190 including the metal source as a cathode and an anode 192. An RF or DC-pulse power supply 170 may be provided to apply a bias to the filament grid antenna, which may increase the ionization rate of the metal vapor flow. Both the ionizing filament grid 140 and the anode 192 are provided in a vicinity of a crucible where the density of the metal atoms is relatively higher than in the remainder of the process chamber 102. The anode 192 may be a relatively thin transparent grid or, the crucible 192 may serve as an anode in relation to the ionizing filament grid 140, which may be cathodic. Thus, while a magnetron sputtering source and a crucible including a metal are illustrated as sputtering sources, other metal vapor sources may be used herein.

Prior to coating, the substrates may optionally be cleaned using a solvent. For example, substrates may be cleaned using a combination of acetone and isopropyl alcohol. Once cleaned, the substrates may be loaded onto a worktable in a process chamber. The process chamber may be pumped down to a pressure of 1E-5 torr to 1E-6 torr (including all values and ranges therein) and an inert process gas may be provided to the processing chamber 102. The substrates may be preheated at a temperature in the range of 100° C. to 500° C., including all values and ranges therein. Prior to coating, the inert process gas may optionally be supplied at a pressure in the range of 1E-4 torr to etch the substrate surface. The substrates may be biased to a negative bias in the range of −30 to −500 V (including all values and ranges therein) via the power supply coupled to the worktable and the process gas may be ionized causing the ionized process gas to bombard the substrate surface. Cleaning may proceed from 1 min to 2 hrs, including all value sand increments therein.

Metal vapor may then be generated. For example, a magnetron may be biased at −200 to −800 V (including all values and ranges therein) and the ionizing process gas may bombard the sputter target forming a metal vapor and creating a metal sputtering flow. The metal flow has a region of plasma density $1E14\ m^{-3}$ or greater due to the electrons generated in ionizing the process gas. A portion of the electrons may be trapped within the magnetic fields created by the magnetron causing further ionization of the process gas and the metal vapor.

The thermionic ionizing grid may be negatively biased relative to the process chamber or another anode at a bias in the range of 10 to 200 volts, including all values and ranges therein. The thermionic ionizing grid may be heated to the thermionic emission temperature causing the release of charged particles, including electrons from the filaments. As the ionizing filament grid may be at least partially located within said region of metal atoms density of $1E14\ m^{-3}$ or greater, the thermionic emission may increase ionization of the process gasses as well as the metal vapor. In addition to thermionic emission, the thermionic ionizing grid may further provide a secondary emission due to ion bombardment of the thermionic filaments. At sufficient temperatures, any metal vapor that deposits on the grid may re-evaporate.

During coating deposition, the process gas may be provided at a pressure in the range of 1E-1 to 1E-5 torr, including all values and ranges therein. Furthermore, the process gas may include not only inert gas, but one or more reactive gasses as well. For example, a titanium sputtering target may be provided in combination with a nitrogen gas forming a TiN coating.

The thermionic cathodic filaments may be heated to thermionic emission temperatures. The thermionic discharge power supply may then be turned on and thermionic discharge may be ignited between the cathodic filaments and the co-axial anode 182. The magnetron discharge and thermionic discharge may overlap to substantially increase plasma density, both in the area of magnetron discharge and between the cathodic filaments and the co-axial anode. For example, when the thermionic filaments are formed from tungsten wire and are 1 mm in diameter and the heating current ranges from 60 to 75 amperes (including all values and ranges therein), the thermionic discharge current may be reached. The thermionic discharge voltage may range between 10 volts and 5000 volts, including all values and ranges therein. The voltage may result in improved ionization efficiency of metal sputtering flow generated by magnetron discharge. When the magnetic focusing coil is activated the electron cloud may begin rotating due to the E×B force, i.e., the Lorentz force, created by the longitudinal magnetic field and the transversal radial electric field. This movement of the electrons may further increase the ionization efficiency of the metal sputtering flow.

EXAMPLES

The following examples are provided for illustrative purposes and are not meant to limit the scope of the disclosure or claimed subject matter appended herein.

Example 1

A DC magnetron with a disc titanium target 100 mm in diameter was used for magnetron sputtering titanium in an Ar—$N_2$ plasma during deposition of TiN coatings. The coatings were deposited on disc SS coupons 3 cm diameter×0.3 cm thick. The substrates to be coated were ultrasonically cleaned in acetone and isopropyl alcohol prior to loading in a vacuum processing chamber. The substrates were positioned on a rotary substrate holder, wherein the diameter of rotation was 200 mm, bringing the substrates to a distance of 20 cm from the magnetron target, wherein the substrate holder was connected to RF 13.56 MHz bias power supply. The substrates were preheated to 250° C. as determined by thermocouple measurements using radiation heaters installed behind rotary substrate holder in the vacuum chamber.

An ionizing grid of tungsten filaments included filaments having a diameter of 250 μm was installed in front of the magnetron target at a distance of 10 mm from the target surface as illustrated in FIG. 2. The dual-layer grid showed in FIG. 7 was used in this trial. The distance between neighboring filaments was 3 mm and the distance between two layers of the grid was 3 mm as well. The filament grid was connected to a DC pulse power supply, which provided high voltage pulses with an amplitude of 1 kV, a pulse duration of 100 μs and a 50% duty cycle. The heating power supply was disconnected from the filament grid.

The following other processing parameters during deposition included as follows. The total gas pressure was 3 mtorr. The magnetron power was 5 W per square centimeter (W/cm$^2$). The substrate holder was turned at 12 rpm and the RF bias power applied to the substrates was ranging from 50 W to 150 W depending on a process stage. The substrates were subjected to ion cleaning in glow discharge at RF power of 50 W prior to the deposition process followed by metal ion etching for 5 minutes at RF power of 150 W. During metal ion etching stage the RF power applied to substrate holder was raised to 150 W. After the metal ion etching stage the deposition stage was commenced when the bias power was reduced to 50 W. The argon was used as the only gas during ion cleaning and metal etching stages of the process. The metal ion etching may improve coating adhesion and is facilitated by use of the ionized grid. During the coating process, nitrogen was added to the chamber gas atmosphere making approximately 10% partial pressure of the total argon and nitrogen gas pressure. The partial pressure of nitrogen was calculated using a measured flowrates of argon and nitrogen. The resulting coatings exhibit relatively reduced density of growth defects and imperfections as well as a relatively finer structure and morphology due to high intensity of ion bombardment assistance during coating deposition process.

Example 2

A nickel coating was deposited using the apparatus illustrated in FIG. 2. The cathode target described above in Example 1 was used. Similarly, substrate coupons were installed 20 cm from the magnetron target on the rotary substrate holder having a 500 mm diameter of rotation. The substrates were preheated to 250° C. by conventional heaters installed in the coating chamber. The ionizing filament grid included tungsten filaments having a 250 μm diameter. The filaments were connected to an RF generator with a frequency of 13.56 MHz. The autopolarization bias potential, which is a DC voltage induced on filament grid by applying the RF bias in a presence of plasma was set to 150 volts and the heating power supply was disconnected from the filament grid. The DC autopolarization bias was measured by voltameter connected to the grid via LC-filter. The remainder of the processing parameters was the same as in Example 1.

Figure 24:
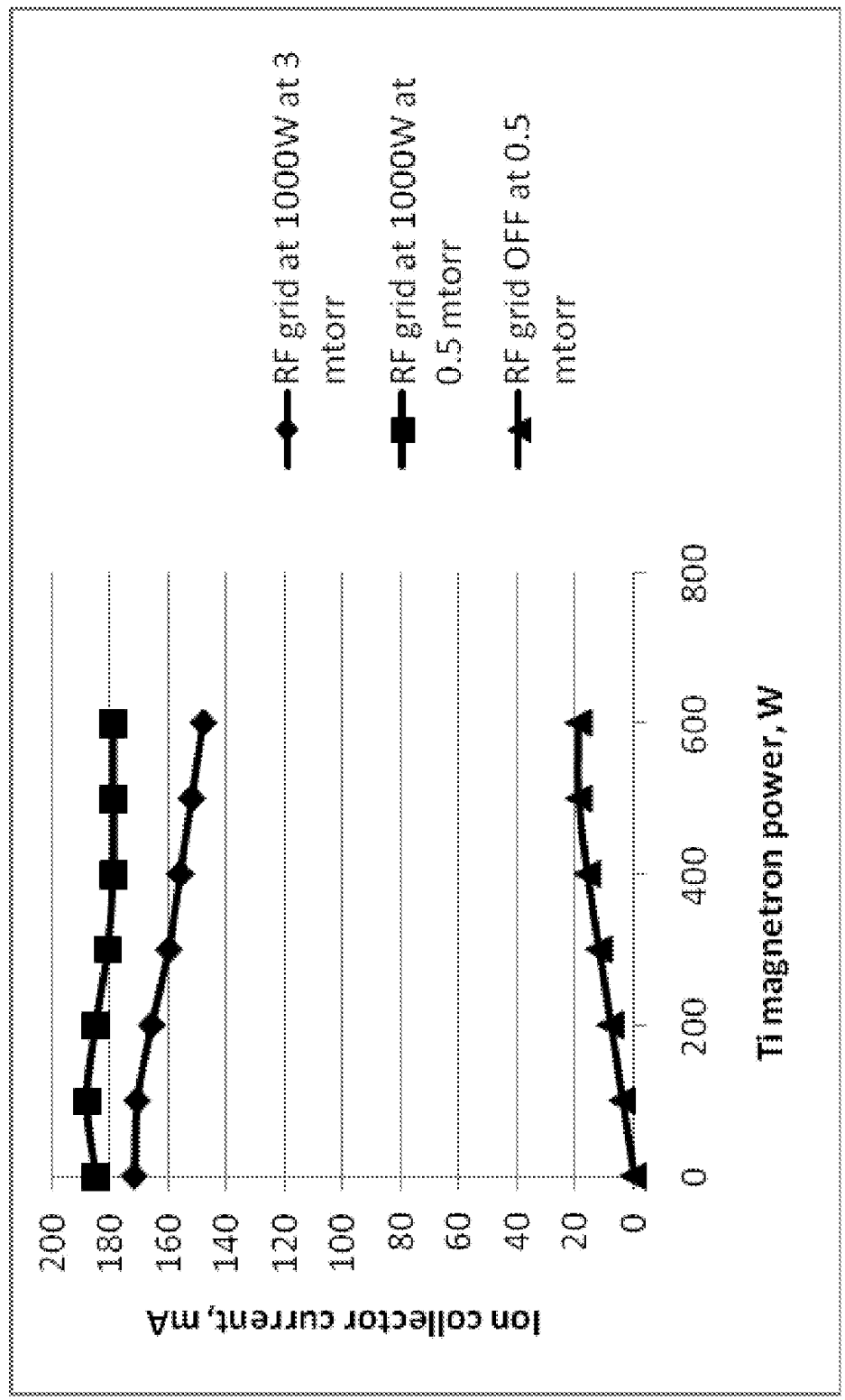
FIG. 24 illustrates the ion current collected in magnetron discharge with and without RF ionizing filament grid assistance at different gas pressures within the process chamber.

FIG. 24 illustrates the ion current collected by a 10 cm diameter disc collector having a potential of −50 volts relative to ground. The total ion current was measured versus magnetron power with and without ionizing filament grid assistance using the ionizing filament grid illustrated in FIG. 7. In addition, two different argon pressures, 0.5 mtorr and 3 mtorr, were examined when RF was applied to the grid. RF was applied to the grid at 13.56 MHz, 1000 watts power. It can be seen from the chart that ion current density produced by magnetron discharge with RF ionizing filament grid ionization both at 3 mtorr and at 0.5 mtorr exceeds the ion current produced by conventional magnetron discharge without ionizing filaments by the order of magnitude.

It was also found that the presence of the RF grid between the magnetron and substrate did not reduce the deposition rate. Specifically, nickel coatings, which were produced using only argon as a plasma creating gas to verify the deposition rates with and without the grid installed at different distances from the magnetron target, shows no substantial influence of the grid on the magnetron coating deposition rate. As the effect of the presence of the filament grid was being examined, the filament grid was not powered. Table 2 illustrates the change in deposition rate without the grid present, with the grid spaced 3 mm from the target and spaced 10 mm from the target.

TABLE 2

Effect of Presence of the Filament Grid on Deposition Rate

| Ni Magnetron Power, W | Grid distance to Magnetron Target, mm | DC Grid Power, W | Deposition Rate, angstroms/s |
|---|---|---|---|
| 400 | N/A | No grid installed | 7.1 |
| 400 | 3 | Grid Off | 6.4 |
| 400 | 10 | Grid Off | 7.65 |

Example 3

A TiN coating was deposited using the apparatus illustrated in FIG. 2. The cathode target described above in Example 1 was used. Similarly, substrate coupons were installed 20 cm from the magnetron target on the rotary substrate holder having a 500 mm diameter of rotation. The substrates were preheated to 250° C. by conventional heaters installed in the coating chamber. The ionizing filament grid included tungsten filaments having a 250 μm diameter. The filaments were connected to a DC bias power supply to set up 100 volts of bias potential to the filament grid. The heating power supply was also connected to the filament grid and the heating current was set to 12 amperes to reach the thermionic emission temperature of about 2100° C. of the tungsten filament grid. The remainder of the processing parameters was the same as in Example 1.

Example 4

A TiN coating was deposited using the apparatus illustrated in FIG. 15, but without magnetic focusing coil 174. A DC magnetron with a disc titanium target 100 mm in diameter long was used for magnetron sputtering titanium in an Ar—$N_2$ plasma during deposition of TiN coatings. The coatings were deposited on stainless steel disc coupons 3 cm in diameter and silicon chips. The substrates to be coated were ultrasonically cleaned in acetone and isopropyl alcohol prior to loading in a vacuum processing chamber. The substrates were positioned on a rotary substrate holder 200 mm in diameter installed immediately above the anode grid 140, bringing the substrates to a distance of 20 cm from the magnetron target, wherein the substrate holder was connected to RF 13.56 MHz bias power supply. The substrates were preheated to 250° C. (determined by thermocouple measurements) using radiation heaters installed behind rotary substrate holder in the vacuum chamber.

The ionizing grid of tungsten filaments included 18 U-shape filaments each composed of 4 pieces of twisted tungsten wire 250 μm in diameter. The filaments were divided in three groups, 6 filaments in each group. The filaments in each group were connected in series, while the three groups were connected to the heating power supply in parallel, providing that the current per each group is 50 amperes while the voltage drop across the filament grid does not exceed 40 volts which was allowed to reach thermionic emission temperature ranging from 2400° C. to 2600° C. The filament grid was installed in front of the magnetron target around the magnetron target at a distance of 10 mm from the target surface as illustrated in FIG. 15. The distance between the front tips of the neighboring filaments in each group of filaments was ~15 mm. The width of the U-shape filaments measured between their ends was ~30 mm and the length of the filament legs were ~40 mm. The filament grid was connected to the (−) pole of DC power supply which provided a bias voltage ranging from 10 to 120 volts, exceeding the first ionization potential of titanium atoms (7 eV) and a thermionic discharge current ranging from 10 to 40 amperes. In a separate setup a DC pulse power supply was also available, which can provide high voltage pulses with an amplitude of 1 kV, a pulse duration of 100 μs and a 50% duty cycle.

The following other processing parameters during deposition included as follows. The argon pressure was 15 mTorr and the nitrogen partial pressure was 2 mTorr. The magnetron power was 5 W per square centimeter (W/cm$^2$). The substrate holder was turned at 12 rpm and the RF bias power applied to the substrates was ranging from 50 W to 150 W depending on a process stage. The substrates were subjected to ion cleaning in glow discharge at RF power of 50 W prior to the deposition process followed by metal ion etching for 5 minutes at RF power of 150 W. After the metal ion etching stage the deposition stage was commenced when the bias power was reduced to 50 W. The metal ion etching may improve coating adhesion and is facilitated by use of the ionized grid. During the coating process, nitrogen was added to the chamber gas atmosphere making approximately 10% partial pressure of the total argon and nitrogen gas pressure. The partial pressure of nitrogen was calculated using a measured flowrates of argon and nitrogen.

Example 5

The apparatus of FIG. 14 was used to deposit a TiN coating. The same cathode target used in Example 1 is employed herein as well. In addition, the substrate coupons are installed 20 cm from the magnetron target on the rotary substrate holder having a 500 mm diameter of rotation. The ionizing filaments including 18 U-shaped tungsten filaments divided in three groups as described in Example 4 were at a distance of 10 mm from the target. The diameter of the tungsten filament is 1 mm. All tungsten filaments in each group are connected in sequence to the heating power supply while three groups of filaments are connected in parallel. The thermionic discharge power supply is connected between the filament grid as a cathode and the tubular anode installed co-axially in relation to the focusing magnetic coil.

The process begins with heating the filament to reach the thermionic temperature of about 2500° C. and the heating current is set at 70 amperes. When the temperature is achieved, the thermionic discharge ignited between the filament grid and the tubular anode. The voltage drop between the filament grid and the anode is setup at −100 volts. The magnetic focusing coil is also turned on to create a longitudinal magnetic field of about 75 Gs. The substrate holder bias is set at 1000 volts to provide ion cleaning and conditioning of substrates in the relatively dense thermionic discharge plasma. After 10 minutes off exposure in thermionic discharge plasma, the magnetron sputtering source is turned on and sputtering of titanium commence.

The titanium sputtering atoms are ionized in a thermionic discharge plasma and deposited on substrates having a bias voltage reduced to −100 volts while depositing the titanium bond layer coating. After deposition of the titanium bond layer of 20 nm thick $N_2$, as a reactive gas, is added to the chamber for deposition of TiN coating. The deposition of the TiN coating continues for 2 hours to reach 5 μm in coating thickness.

Example 6

Figure 25:
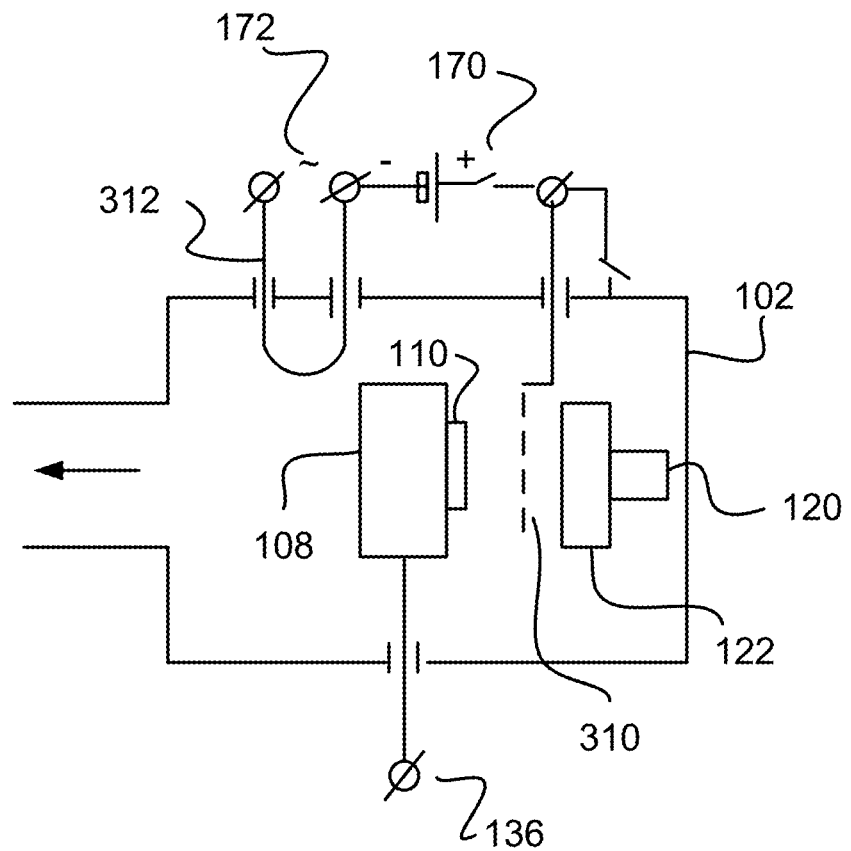
FIG. 25 illustrates a schematic view of an embodiment of a thermionic charge assisted magnetron sputtering process with an anode screen positioned in front of the magnetron target.

The device described in FIG. 25 was utilized to evaluate the effectiveness of magnetron sputtering assisted by thermionic discharge with an anodic filament grid 310 installed in front of the magnetron target 122, as between the target 122 and the substrate 110. Two conventional thermionic cathode filaments 312 were installed at the top of the vacuum chamber, used as an electron source. The filaments were connected to AC power supply 172 for heating to reach the thermionic emission temperature. The thermionic arc discharge power supply 170 was connected between the cathode (negative) filaments and the anodic (positive) filament grid. The chamber turntable of 6 inches by 6 inches by 6 inches was installed in front of the magnetron and serviced both as a substrate holder and current collector probe. The bias potential of the ion collector probe was set at −50 volts.

Figure 26:
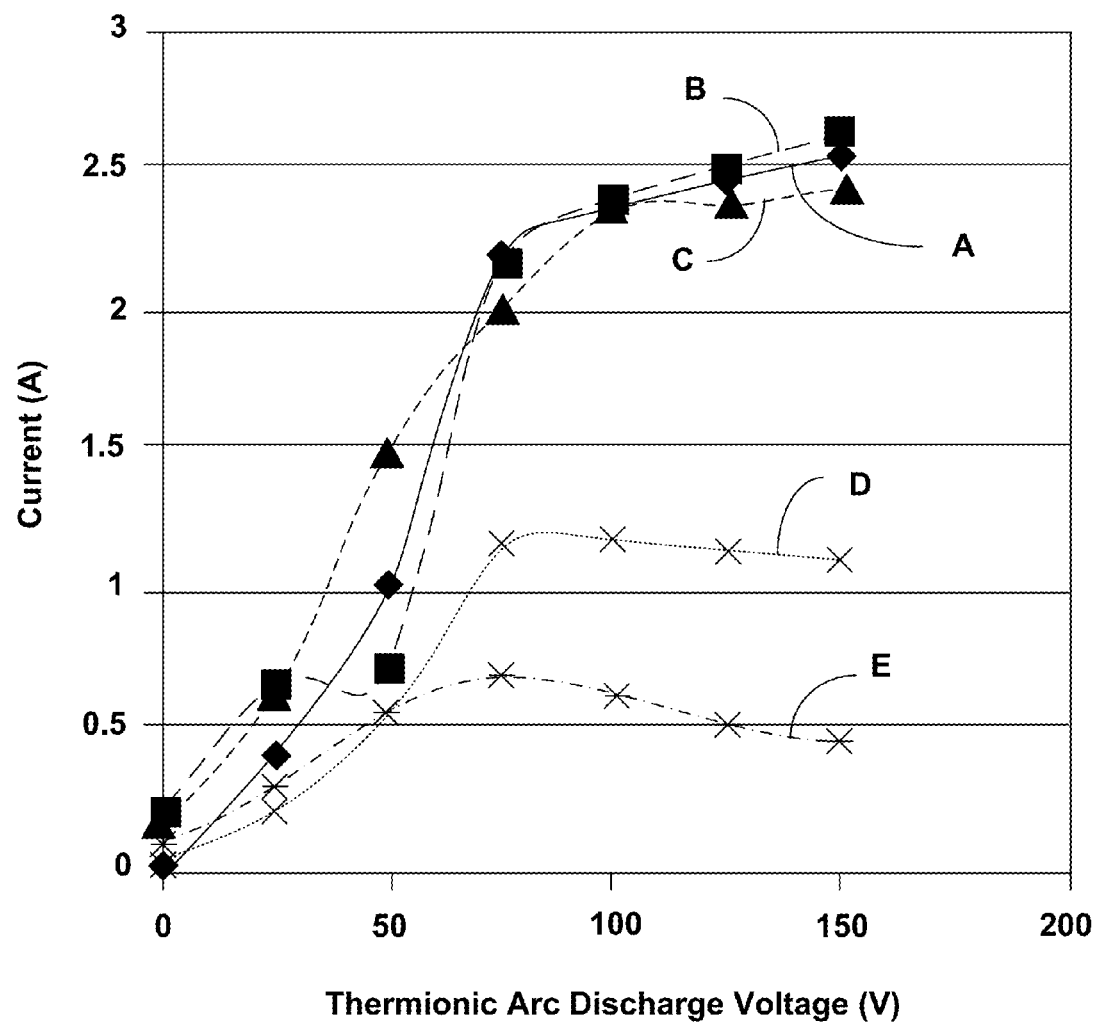
FIG. 26 illustrates a chart of ion current collected by a substrate holder and thermionic discharge currents generated by the system of FIG. 25.

FIG. 26 illustrates the measurements of thermionic discharge current and ion current collected by the substrate holder probe verses thermionic discharge voltage with and without magnetron discharge at 0.5 mtorr of argon pressure. The filament heating current was set at 50 amperes for all of the measurements. Table 3 illustrates the parameters used for the various samples in the chart.

TABLE 3

Process parameters description for the chart shown in FIG. 26

| Curve ID | Curve description | Anodic grid potential vs. ground | Magnetron | Data scale |
|---|---|---|---|---|
| A | Thermionic arc discharge current | Positive | OFF | x0.1 |
| B | Thermionic arc discharge current | Grounded | OFF | x0.1 |
| C | Thermionic arc discharge current | Positive | ON | x0.1 |
| D | Ion current collected by substrate holder probe | Positive | OFF | |
| E | Ion current collected by substrate holder probe | Grounded | OFF | |

It can be seen from the chart that the ion current collected by the substrate collector probe is nearly two times greater when the anodic filament grid serves as an anode of the thermionic arc discharge. The magnetron discharge does not appear to have considerable influence on plasma characteristics. It can be seen that the thermionic discharge current is nearly the same in both cases, i.e., when the anodic grid serves as an anode or the anode of the thermionic discharge is grounded as in the conventional PEMS process. Titanium nitride coatings were deposited on 1 inch×1 inch×⅛ inch titanium coupons and silicon wafer samples in two processes. In the first process, the anodic grid was isolated and connected to the positive pole of the thermionic arc discharge power supply as shown in FIG. 20. The following process parameters were used in this process. Cleaning of the substrates occurred for 30 minutes. The argon pressure was set to 1 mtorr, the thermionic arc discharge was set to 150 volts, the thermionic arc current was set to 14 amperes, the filament heating current was set to 45 amperes, the substrate bias was set to −150 volts and the substrate ion current was set from 1-1.2 amperes. Coating was then initiated and lasted for 1 hour. During coating the argon/nitrogen pressure was set at 1 mtorr, the nitrogen flow rate was 10 sccm, the argon flow rate was 40 sccm, the magnetron power was set at 1 kW, the thermionic discharge voltage was set at 150 volts, the thermionic arc current was set at 35 amperes, the filament heating current was set at 50 amperes, the substrate bias was set at −40 volts and the substrate ion current was approximately 1 ampere. The thickness of the TiN film deposited during this time was about 1 μm, which indicates a deposition rate of 1 μm/hr.

Figure 27:
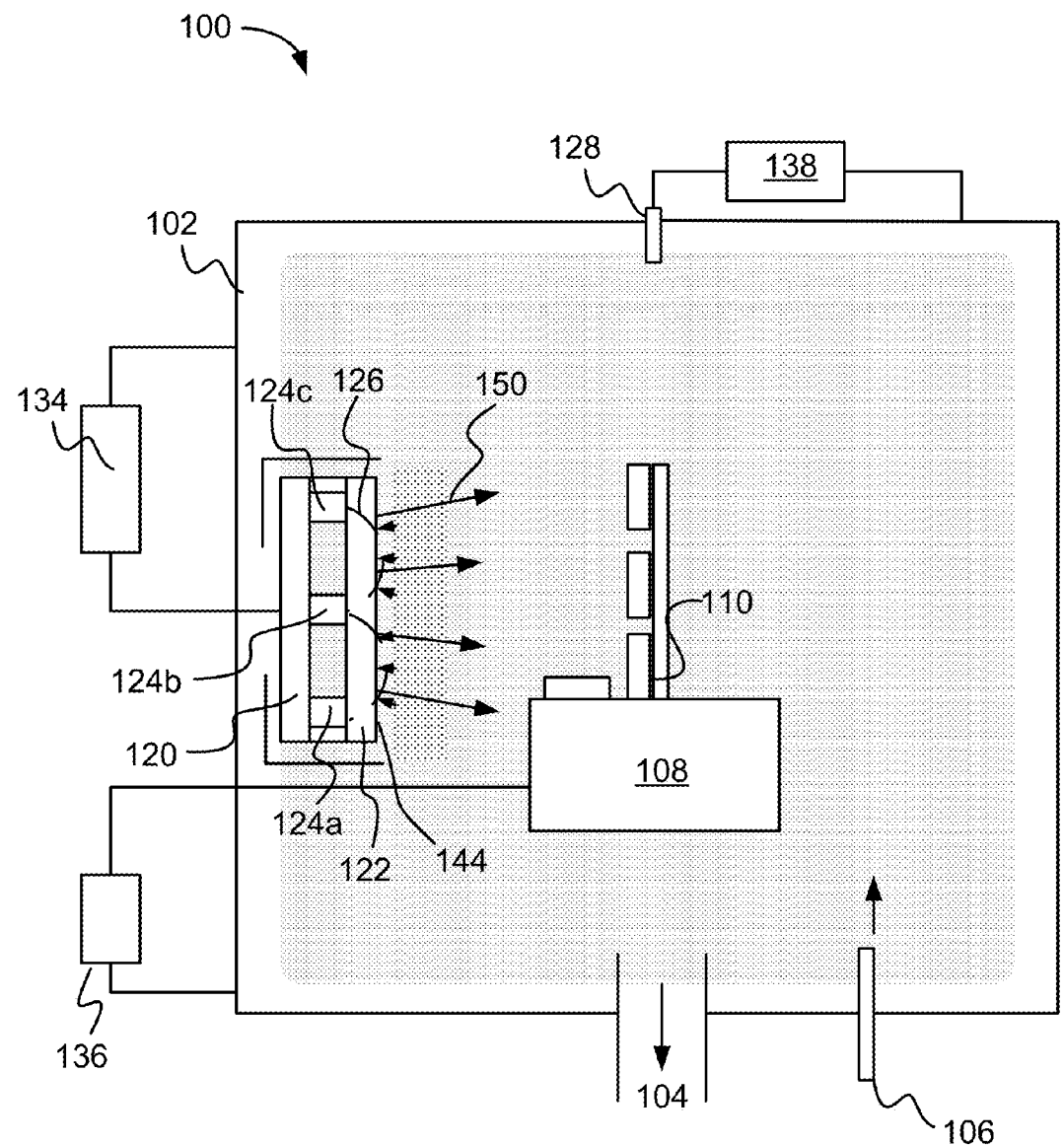
FIG. 27 illustrates a schematic view of a plasma enhanced magnetron sputtering system.

For comparison, a second TiN deposition process was performed using all setting identical to the first process, but with conventional state-of-the-art PEMS setup using a grounded anode for thermionic arc discharge as shown schematically in FIG. 27. As can be seen in the figure, an ionizing filament grid is not included in the PEMS set-up. In this process, it was found that the substrate ion current was about 0.2 amperes or 5 times less than in the process with the anodic filament grid. In addition, the deposition rate was two times less than in the process disclosed herein with the anodic filament grid connected to the positive pole of the thermionic discharge power supply. It was also found that magnetron sputtering process with thermionic discharge utilizing anodic filament grid provides much smoother and featureless surface morphology than prior art PEMS processes utilizing thermionic arc discharge with a grounded anode. The density of coating defects in a TiN coating deposited with anodic grid installed near the magnetron target was found to be at least an order of magnitude lower than that of the TiN coatings deposited in a standard PEMS process with grounded anode.

Example 7

The apparatus of FIG. 14 was used to deposit a TiN coating. The same cathode target used in Example 1 was employed herein as well. In addition, the substrate coupons including 30 mm diameter SS discs and silicon chips were installed 15 cm from the magnetron target on the substrate holder having a 100 mm. The substrate holding table also served as an ion collector probe to assess the ionization efficiency provided by thermionic (T/I) discharge. The substrate table was connected to the bias power supply to apply bias voltage in a range from 40 to 120 volts during different stages of the process trials. The ionizing filaments including 18 U-shaped tungsten filaments divided in three groups, 6 filaments in each group as described in Example 4 were at a distance of 50 mm from the target (defining as the distance between the target and the lowest side of U-shape filament). The tungsten filaments were made of four tungsten wires 0.20 mm in diameter each twisted together to form a 4-wire filament. All tungsten filaments in each group are connected in sequence to the heating power supply while three groups of filaments are connected in parallel. The thermionic discharge power supply is connected between the filament grid as a cathode and the tubular anode installed co-axially in relation to the focusing magnetic coil. The Miller XMT 304 welder was used as a DC power supply to heat the filaments. The XANTREX voltage source power supply was used to apply thermionic discharge voltage to the filaments.

The process begins with heating the filaments to reach the thermionic temperature of about 2500° C. and the heating current is set at 135 amperes which is distributed evenly between three parallel groups of filaments with 45 amperes per each of three groups. When the temperature is achieved, the thermionic discharge ignited between the filament grid and the grounded chamber. In two consequent process runs the voltage drop between the filament grid and the anode was setup at −45 volts and −25 volts respectfully. The magnetic focusing coil was not used in this run. The substrate holder bias was set at 120 volts to provide initial ion cleaning and conditioning of substrates in the dense thermionic discharge plasma. After 10 minutes of exposure in thermionic discharge plasma, the magnetron sputtering source was turned on and sputtering of titanium commence in Ar-nitrogen reactive gas atmosphere. The bias voltage was reduced to −50 volts during TiN coating deposition stage. The magnetron voltage during deposition of TiN coatings by T/I plasma enhanced magnetron sputtering process was fixed at −450 volts. The nitrogen to argon ration during coating deposition process was fixed at 1:2.

In additional process run the filament were removed and TiN coating was deposited by un-ionized magnetron discharge with magnetron voltage fixed at −400 volts with the same nitrogen-to argon ration (1:2) as for TiN coating processes with T/I discharge ionization.

The deposited TiN coatings were examined by ESD for their composition. The coating thickness obtained in these coating deposition processes was in a range from 0.5 to 1.2 μm. The hardness of the TiN films deposited on silicon substrates were measured by means of nanoindentation. The results of these measurements are shown in Tables 4a and 4b below.

TABLE 4a

| Run # | Filament current, A | Filament voltage, V | T/I discharge voltage, V | T/I discharge current, A | Magnetron voltage, V | Magnetron current, A |
|---|---|---|---|---|---|---|
| 1 | 135 | 42 | 25 | 18 | 450 | 11 |
| 2 | N/A | N/A | N/A | N/A | 400 | 1.6 |

TABLE 4b

| Run # | Collected ion current density at −50 V bias, mA/cm$^2$ | Ti content atomic percent | N content, atomic percent | Hardness, GPa | Note |
|---|---|---|---|---|---|
| 1 | 3.2 | 50 | 50 | >20 as per stoichiometric TiN coating | |
| 2 | 0.03 | 76 | 24 | 8.5 | T/I filaments removed |

From the Table 4 it can be seen that without T/I discharge assistance the TiN coatings deposited by magnetron sputtering in near identical process conditions have substantial deficit of nitrogen resulting in low hardness of these coatings. On the other hand the TiN coatings deposited by T/I discharge ionized magnetron sputtering are stoichiometric. This result appears to demonstrate that increased ionization improves the reactivity of the nitrogen in TiN forming deposition process. It can be seen that T/I discharge allows to increase ionization in magnetron vapor plasma by a factor of 100. It can be also seen that the magnetron current and the corresponding magnetron voltage increases dramatically (by a factor of 10) by T/I discharge assistance.

Figure 28:
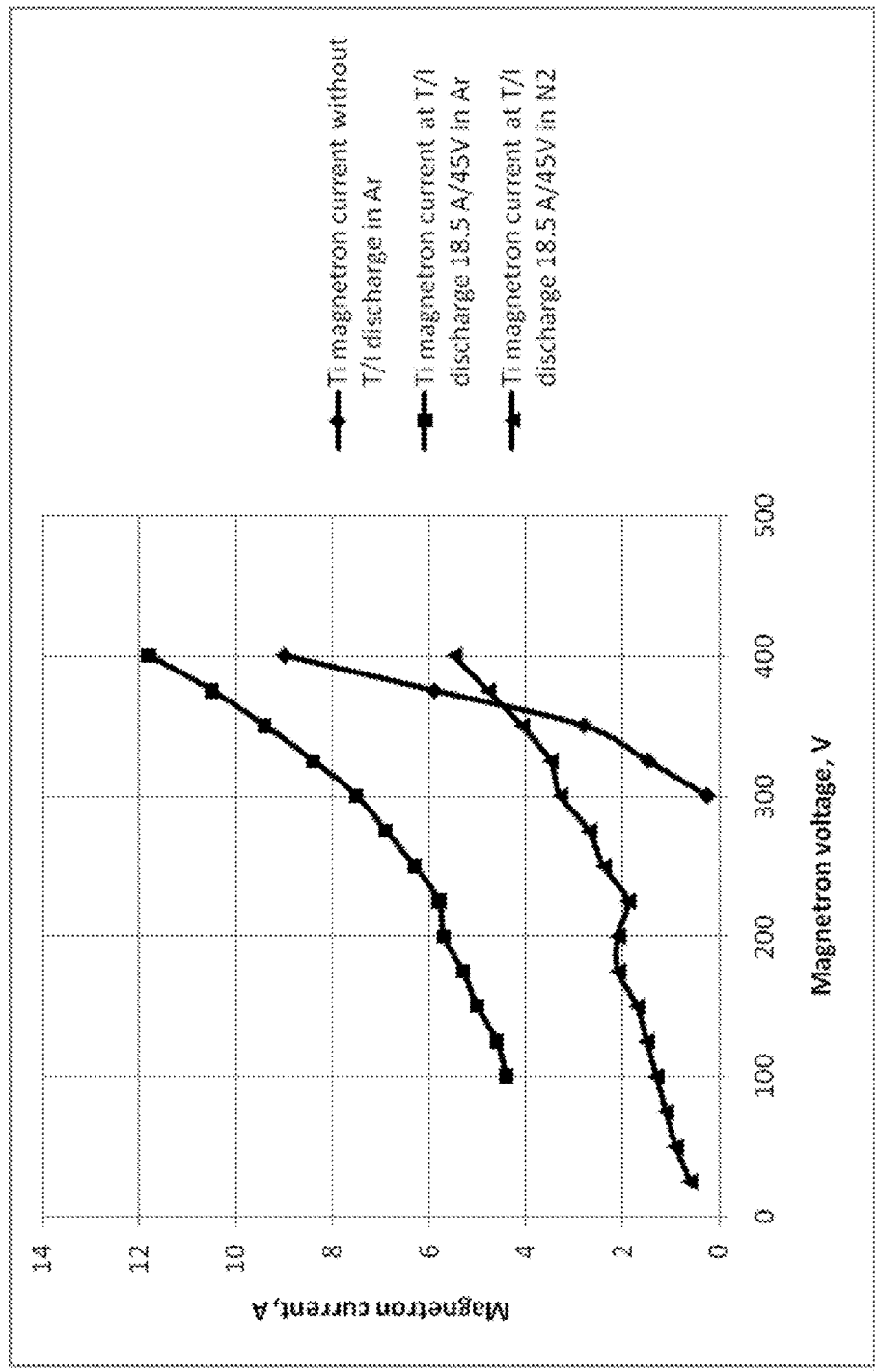
FIG. 28 illustrates a voltage-current characteristics of a magnetron with and without ionizing thermionic discharge.
Figure 29:
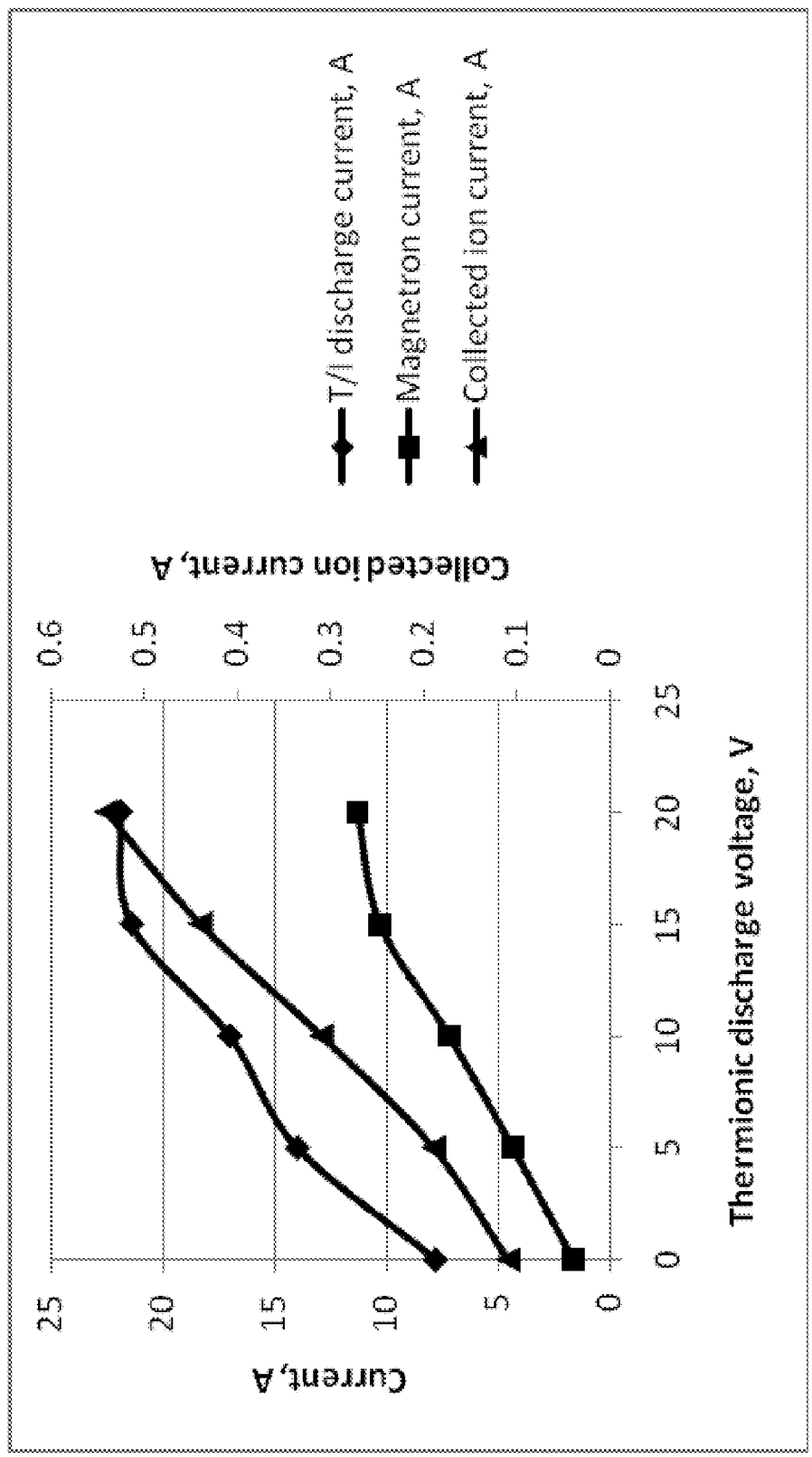
FIG. 29 illustrates the influence of thermionic discharge on magnetron current at fixed magnetron voltage of −400 volts and on collected ion current.

In separate experiments, the measurements of the electrical parameters were taken using a setup identical to the one used in coating deposition trials described in this example. The I-V characteristics of the magnetron discharge with and without thermionic discharge plasma enhancement provided by ionizing filament grid of the present invention are shown in FIG. 28. It can be seen that T/I discharge is coupled with the magnetron discharge and allows to substantially increase the power of magnetron discharge. It can be also seen that magnetron discharge with T/I discharge assistance is operating stably in a wide range of currents both in argon and in nitrogen while conventional magnetron discharge current range is restricted to the narrow current area. The influence of T/I discharge on magnetron discharge current in argon is presented in FIG. 29. It can be seen that by increasing the power of applied T/I discharge the magnetron current at fixed magnetron voltage of −400 volts can be increased by the order of magnitude. At the same time the ionization efficiency of the magnetron sputtering process increases more than 10 times.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method of depositing a coating by vapor deposition comprising:
   providing a substrate on a worktable;
   biasing said worktable;
   ionizing a process gas, generating a metal vapour, and creating a metal flow;
   providing a thermionic emission from a thermionic ionizing grid including thermionic filaments, wherein said thermionic ionizing grid is at least partially located within said metal flow in a region having a density in the range of 1E14 m$^{-3}$ to 1E24 m$^{-3}$ and said thermionic emission ionizes said metal flow; and
   coating said substrate with said metal vapor.

2. The method of claim 1, wherein said metal vapor is generated by a magnetron.

3. The method of claim 1, further comprising providing a secondary emission from said thermionic ionizing grid due to bombardment of said thermionic filaments.

4. The method of claim 1, providing a negative bias to said thermionic ionizing grid relative to an anode.

5. The method of claim 4, wherein said anode is a process chamber.

6. The method of claim 4, wherein said anode comprises a filament grid.

7. The method of claim 1, wherein said substrate is preheated prior to coating.

8. The method of claim 1, wherein said substrate is cleaned prior to coating.

\* \* \* \* \*